(12) United States Patent
Kang et al.

(10) Patent No.: US 6,841,394 B2
(45) Date of Patent: Jan. 11, 2005

(54) NONVOLATILE FERROELECTRIC MEMORY DEVICE AND METHOD FOR FABRICATING THE SAME

(75) Inventors: Hee Bok Kang, Daejeon-si (KR); Jun Sik Lee, Chungcheongbuk-do (KR)

(73) Assignee: Hyundai Electronics Industries, Co., Ltd., Kyoungki-Do (KR)

( * ) Notice: Subject to any disclaimer, the term of this patent is extended or adjusted under 35 U.S.C. 154(b) by 166 days.

(21) Appl. No.: 09/739,753

(22) Filed: Dec. 20, 2000

(65) Prior Publication Data

US 2001/0006473 A1 Jul. 5, 2001

(30) Foreign Application Priority Data

Dec. 27, 1999 (KR) ......................................... 1999-62647

(51) Int. Cl.[7] ............................................... H01L 21/00
(52) U.S. Cl. ............................ 438/3; 438/239; 438/240
(58) Field of Search ............................ 438/3, 239, 240, 438/243; 365/145

(56) References Cited

U.S. PATENT DOCUMENTS

| | | | | | |
|---|---|---|---|---|---|
| 4,873,664 | A | | 10/1989 | Eaton, Jr. ..................... | 365/145 |
| 5,350,705 | A | * | 9/1994 | Brassington et al. ........ | 257/295 |
| 5,638,318 | A | | 6/1997 | Seyyedy ...................... | 365/145 |
| 5,680,344 | A | | 10/1997 | Seyyedy ...................... | 365/145 |
| 5,854,104 | A | * | 12/1998 | Onishi et al. ................ | 438/240 |
| 6,118,687 | A | | 9/2000 | Kang ........................... | 365/145 |
| 6,130,102 | A | * | 10/2000 | White et al. ................... | 438/3 |
| 6,141,238 | A | * | 10/2000 | Forbes et al. ................ | 365/145 |
| 6,238,963 | B1 | * | 5/2001 | Chen et al. .................. | 438/239 |
| 6,258,658 | B1 | * | 7/2001 | Bohm et al. ................. | 438/243 |
| 6,306,704 | B1 | * | 10/2001 | Kang et al. .................. | 438/238 |
| 6,319,731 | B1 | * | 11/2001 | Kang et al. ..................... | 438/3 |
| 6,335,211 | B1 | * | 1/2002 | Lee .............................. | 438/22 |
| 6,337,238 | B1 | * | 1/2002 | Nakabayashi ............... | 438/240 |
| 6,524,868 | B2 | * | 2/2003 | Choi et al. ..................... | 438/3 |
| 6,544,834 | B1 | * | 4/2003 | Sugawara et al. .......... | 438/240 |
| 2001/0003662 | A1 | * | 6/2001 | Kim ............................ | 438/239 |
| 2003/0077844 | A1 | * | 4/2003 | Lee ............................... | 438/3 |

FOREIGN PATENT DOCUMENTS

| | | |
|---|---|---|
| DE | 19846264 A1 | 6/1999 |
| DE | 10032311 A1 | 2/2001 |

\* cited by examiner

*Primary Examiner*—Richard Elms
*Assistant Examiner*—Brad Smith
(74) *Attorney, Agent, or Firm*—Fleshner & Kim, LLP

(57) ABSTRACT

A nonvolatile ferroelectric memory device and a method for fabricating the same are provided that increase a process margin and simplify process steps. In addition, a number of masks is reduced to save the cost and at the same time minimize or reduce a layout area. The nonvolatile ferroelectric memory device can include first and second split wordlines formed along a first direction on a substrate at prescribed intervals, a first electrode of a first ferroelectric capacitor on the second split wordline and a first electrode of a second ferroelectric capacitor on the first split wordline, first and second ferroelectric layers respectively on surfaces of the first electrodes of the first and second ferroelectric capacitors, and second electrodes of the first and second ferroelectric capacitors, respectively, on surfaces of the first and second ferroelectric layers. A first conductive layer connects the second electrode of the first ferroelectric capacitor with the substrate at one side of the second split wordline, and a second conductive layer connects the second electrode of the second ferroelectric capacitor with the substrate at one side of the first split wordline. First and second bitlines are coupled with the substrate at another sides of the respective split wordlines.

18 Claims, 38 Drawing Sheets

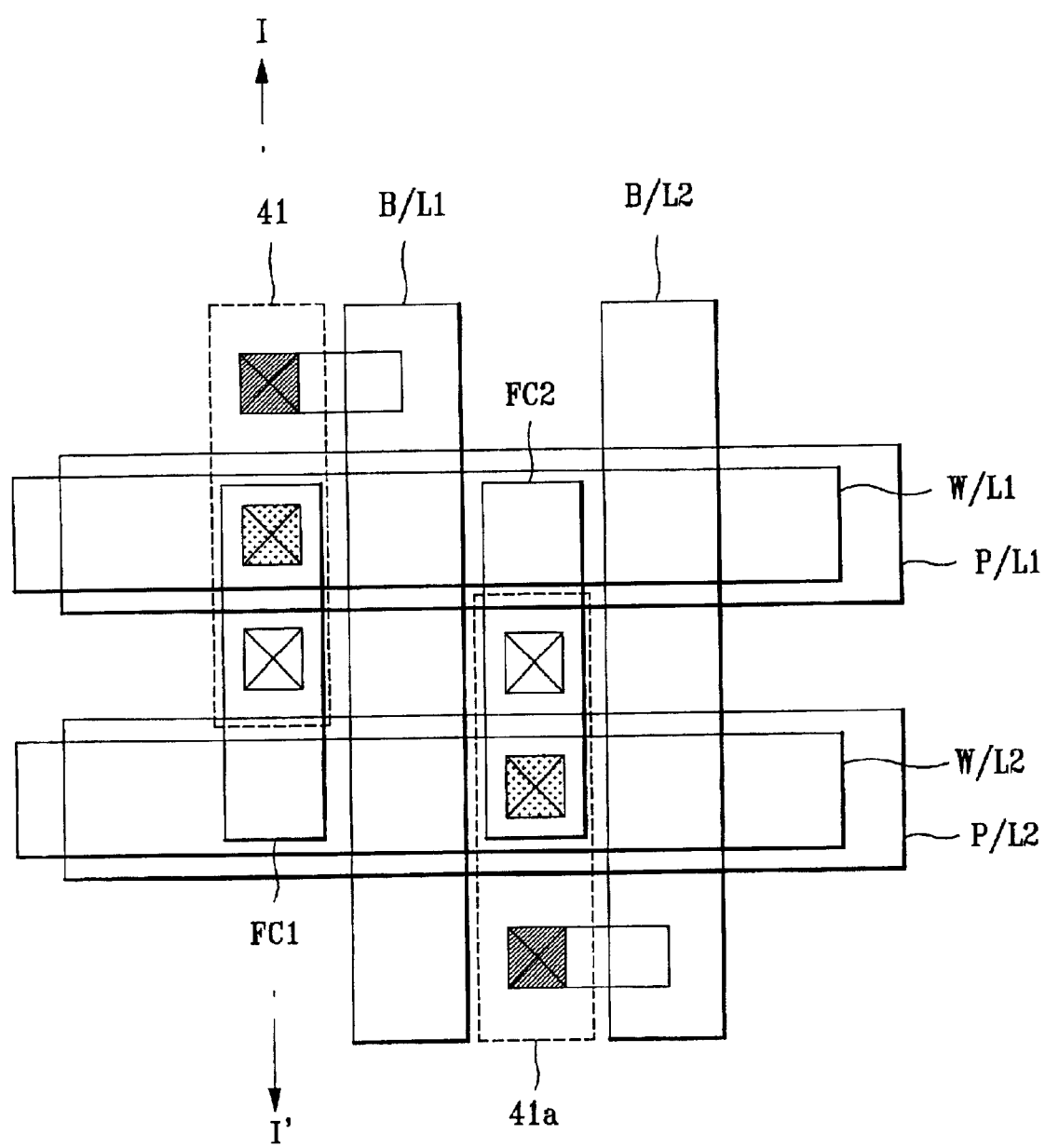

FIG, 10f
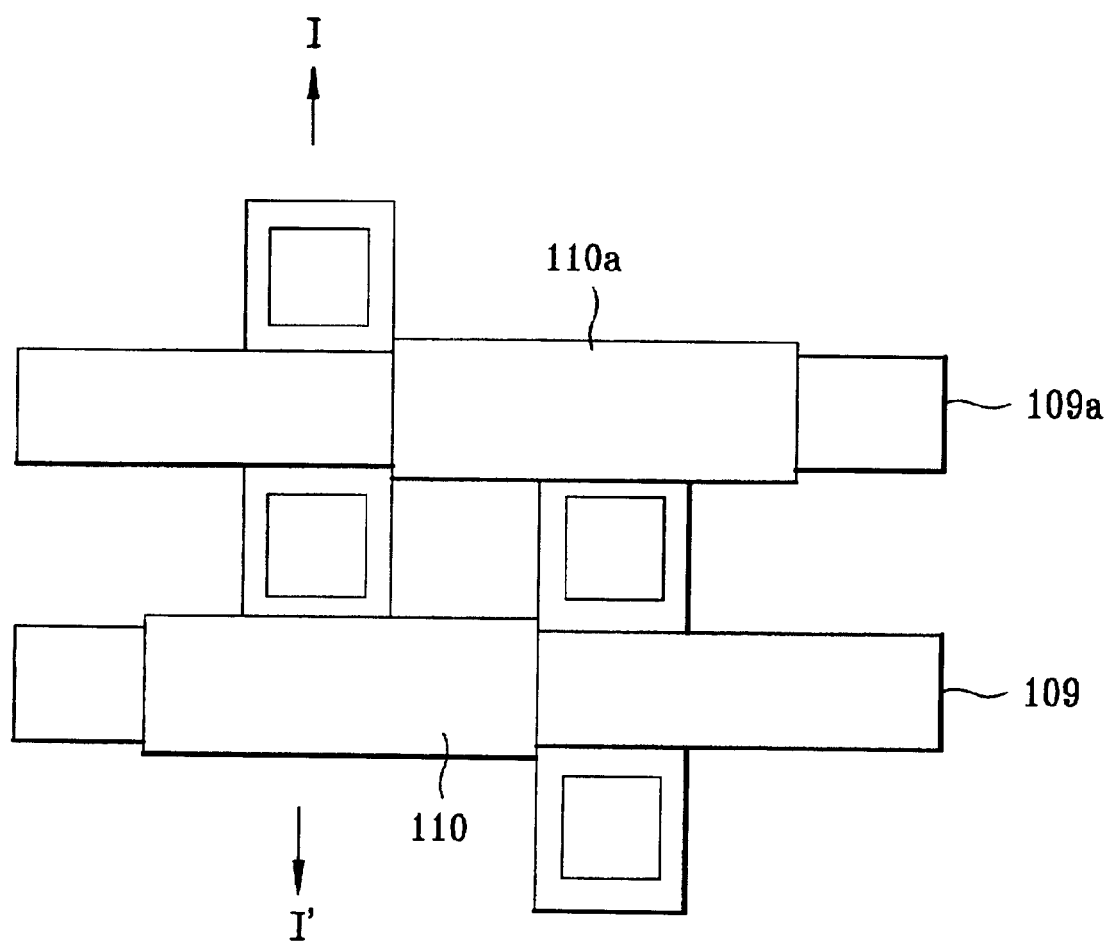

NONVOLATILE FERROELECTRIC MEMORY DEVICE AND METHOD FOR FABRICATING THE SAME

BACKGROUND OF THE INVENTION

1. Field of the Invention

The present invention relates to a nonvolatile ferroelectric memory device, and more particularly, to a nonvolatile ferroelectric memory device and a method for fabricating the same.

2. Background of the Related Art

Generally, a nonvolatile ferroelectric memory, i.e., a ferroelectric random access memory (FRAM) has a data processing speed equal to a dynamic random access memory (DRAM) and retains data even in power off. For this reason, the nonvolatile ferroelectric memory has received much attention as a next generation memory device.

The FRAM and DRAM are memory devices with similar structures, but the FRAM includes a ferroelectric capacitor having a high residual polarization characteristic. The residual polarization characteristic permits data to be maintained even if an electric field is removed.

FIG. 1 shows hysteresis loop of a general ferroelectric. As shown in FIG. 1, even if polarization induced by the electric field has the electric field removed, data is maintained at a certain amount (i.e., d and a states) without being erased due to the presence of residual polarization (or spontaneous polarization). A nonvolatile ferroelectric memory cell is used as a memory device by corresponding the d and a states to 1 and 0, respectively.

A related art nonvolatile ferroelectric memory device will now be described. FIG. 2 shows unit cell of a related art nonvolatile ferroelectric memory.

As shown in FIG. 2, the related art nonvolatile ferroelectric memory includes a bitline B/L formed in one direction, a wordline W/L formed to cross the bitline, a plate line P/L spaced apart from the wordline in the same direction as the wordline, a transistor T1 with a gate connected with the wordline and a source connected with the bitline, and a ferroelectric capacitor FC1. A first terminal of the ferroelectric capacitor FC1 is connected with a drain of the transistor T1 and second terminal is connected with the plate line P/L.

The data input/output operation of the related art nonvolatile ferroelectric memory device will now be described. FIG. 3a is a timing chart illustrating the operation of the write mode of the related art nonvolatile ferroelectric memory device, and FIG. 3b is a timing chart illustrating the operation of read mode thereof.

During the write mode, an externally applied chip enable signal CSBpad is activated from high state to low state. At the same time, if a write enable signal WEBpad is applied from high state to low state, the write mode starts. Subsequently, if address decoding in the write mode starts, a pulse applied to a corresponding wordline is transited from low state to high state to select a cell.

A high signal in a certain period and a low signal in a certain period are sequentially applied to a corresponding plate line in a period where the wordline is maintained at high state. To write a logic value "1" or "0" in the selected cell, a high signal or low signal synchronized with the write enable signal WEBpad is applied to a corresponding bitline.

In other words, a high signal is applied to the bitline, and if the low signal is applied to the plate line in a period where the signal applied to the wordline is high, a logic value "1" is written in the ferroelectric capacitor. A low signal is applied to the bitline, and if the signal applied to the plate line is high, a logic value "0" is written in the ferroelectric capacitor.

With reference to FIG. 3b, the reading operation of data stored in a cell by the above operation of the write mode will now be described. If an externally applied chip enable signal CSBpad is activated from high state to low state, all of bitlines become equipotential to low voltage by an equalizer signal EQ before a corresponding wordline is selected.

Then, the respective bitline becomes inactive and an address is decoded. The low signal is transited to the high signal in the corresponding wordline according to the decoded address so that a corresponding cell is selected.

The high signal is applied to the plate line of the selected cell to destroy data corresponding to the logic value "1" stored in the ferroelectric memory. If the logic value "0" is stored in the ferroelectric memory, the corresponding data is not destroyed.

The destroyed data and the data that is not destroyed are output as different values by the ferroelectric hysteresis loop, so that a sensing amplifier senses the logic value "1" or "0". In other words, if the data is destroyed, the "d" state is transited to an "f" state as shown in hysteresis loop of FIG. 1. If the data is not destroyed, "a" state is transited to the "f" state. Thus, if the sensing amplifier is enabled after a set time has elapsed, the logic value "1" is output in case that the data is destroyed while the logic value "0" is output in case that the data is not destroyed.

As described above, after the sensing amplifier outputs data, to recover the data to the original data, the plate line becomes inactive from high state to low state at the state that the high signal is applied to the corresponding wordline.

A related art nonvolatile ferroelectric memory and a method for fabricating the nonvolatile ferroelectric memory will now be described. FIG. 4a is a diagram that illustrates a layout of a related art nonvolatile ferroelectric memory.

Referring to FIG. 4a, the related art nonvolatile ferroelectric memory is provided with a first active region 41 and a second active region 41a asymmetrically formed at fixed intervals. A first wordline W/L1 is formed to cross the first active region 41, and a second wordline W/L2 is formed to cross the second active region 41a spaced a distance from the first wordline W/L1. A first bitline B/L1 is formed in a direction to cross the first and second wordlines at one side of the first active region 41, and a second bitline B/L2 is formed parallel to the first bitline B/L1 to cross the first and second wordlines at one side of the second active region 41a. A first ferroelectric capacitor FC1 is formed over the first wordline W/L1 and the second wordline W/L2 and is connected to the first active region 41. A second ferroelectric capacitor FC2 is formed over the first wordline W/L1 and is electrically connected to the second active region 41a. A first plate line P/L1 is formed over the first wordline W/L1 and is electrically connected to the first ferroelectric capacitor FC1, and a second plate line P/L2 is formed over the second wordline W/L2 and is electrically connected to the second ferroelectric capacitor FC2. FIG. 4a is a diagram that illustrates a layout of a unit cell, wherein the related art nonvolatile ferroelectric memory has the first and second ferroelectric capacitors FC1 and FC2 formed extending along a bitline direction, and the first plateline P/L1 formed over the first wordline W/L1 and the second plateline P/L2 formed over the second wordline W/L2.

FIG. 4b is a diagram that illustrates a cross-section across line I–I' in FIG. 4a. Referring to FIG. 4b, the related art nonvolatile ferroelectric memory is provided with a substrate 51 having an active region and a field region defined thereon, a first wordline 54 and a second wordline 54a formed over the active region and the field region with a first insulating layer 53 disposed inbetween, and first source/drain impurity regions 55 and 56 formed on both sides of the first wordline 54. Second source/drain impurity regions (not shown) are formed on both sides of the second wordline 54a. A second insulating layer 57 is formed on an entire surface inclusive of the first and second wordlines 54 and 54a having a contact hole exposing the first drain impurity region 56, and a first plug layer 58a is stuffed in the contact hole. A first metal layer 59 connects the first plug layer 58a and the first bitline (not shown). A third insulating layer 60 is formed on an entire surface inclusive of the first metal layer 59 having a contact hole exposing the first source impurity region 55, and a second plug layer 62 is stuffed in the contact hole. A barrier metal layer 63 is electrically connected to the second plug layer 62 and extended horizontally over the first wordline to the second wordline 54a. A lower electrode 64 of the first ferroelectric capacitor FC1 is formed on the barrier metal layer 63, a ferroelectric film 65 and an upper electrode 66 of the first ferroelectric capacitor are stacked on the lower electrode 64 of the first ferroelectric capacitor FC1 in succession. A fourth insulating layer 67 is formed on an entire surface inclusive of the upper electrode 66 of the second ferroelectric capacitor. A first plate line 68 is formed over the first wordline 54 and electrically connected to the upper electrode 66 of the first ferroelectric capacitor FC1 through the fourth insulating layer, and a second plate line 68a formed over the second wordline 54a spaced from the first plate line 68.

A method for fabricating the related art nonvolatile ferroelectric memory of FIGS. 4a–4b will now be described. FIGS. 5a–5f are diagrams that illustrate cross-sections showing the steps of a method for fabricating the related art nonvolatile ferroelectric memory shown along line I–I' in FIG. 4a. As shown in FIG. 5a, a portion of a semiconductor substrate 51 is etched to form a trench, and an insulating film is stuffed in the trench to form a device isolation layer 52. A first insulating layer 53 is formed on the substrate in the active region inclusive of the device isolation layer 52. A wordline material layer is formed on the first insulating layer 53, and patterned to form first and second wordlines 54 and 54a at fixed intervals.

As shown in FIG. 5b, the wordlines 54 and 54a are used as masks in implanting impurity ions to form a source impurity region 55 and a drain impurity region 56 having a conduction type opposite to the substrate 51. The source/drain impurity regions 55 and 56 are source/drain impurity regions of the first transistor T1 that takes the first wordline 54 as a gate electrode. Then, a second insulating layer 57 is formed on an entire surface of the substrate 51 inclusive of the first and second wordlines 54 and 54a. A photoresist layer (not shown) is coated on the second insulating layer 55 and patterned, and the patterned photoresist layer is used as a mask in selectively etching the second insulating layer 57 to form a contact hole 58 exposing the drain impurity region 56.

As shown in FIG. 5c, a conductive material is stuffed in the contact hole to form a first plug layer 58a, and first metal layer 59 is formed to connect the first plug layer 58a and the first bitline B/L1. Though not shown, the second bitline B/L2 is electrically connected to the drain impurity region of the second transistor T2.

As shown in FIG. 5d, a third insulating layer 60 is formed on an entire surface inclusive of the first metal layer 59. A photoresist layer (not shown) is coated on the third insulating layer 60, patterned and used as mask in selectively etching the third insulating layer to form a contact hole 61 exposing the source impurity region 55.

As shown in FIG. 5e, a conductive material is stuffed in the contact hole 61 to form a second plug layer 62 electrically connected to the source impurity region 55. A barrier metal layer 63 is formed to be electrically connected to the second plug layer 62 and a lower electrode 64 of the first ferroelectric capacitor FC1. The lower electrode 64, a ferroelectric film 65 and upper electrode 66 of the first ferroelectric capacitor are successively formed on the barrier metal layer 63.

As shown in FIG. 5f, a fourth insulating layer 67 is formed on the upper electrode 66 of the first ferroelectric capacitor and selectively etched by photolithography to form a contact hole exposing a portion of the upper electrode 66 of the first ferroelectric capacitor FC1. Upon formation of a first plate line 68 connected with the upper electrode 66 of the first ferroelectric capacitor through the contact hole, the related art process for fabricating nonvolatile ferroelectric memory is completed. A second plate line 68a is also shown in FIG. 5f.

As described above, the related art nonvolatile ferroelectric memory and the related art method for fabricating the same have various disadvantages. A requirement to form the lower electrode of a capacitor thicker for increasing a sectional area of the lower electrode for securing capacitance causes a problem in that etching of the lower electrode is difficult because the lower electrode of the capacitor is formed of metal. Further, the fabrication process is very difficult because the plate line should be formed in a small space so that a sufficient space is secured distinguishing the plate line from a wordline in an adjacent cell as the wordline and the plate line are formed in every unit cell. The small space complicates the corresponding process steps. Further, since an upper electrode of the ferroelectric capacitor and the plate line are connected with each other through the contact hole, the number of masks for the formation of the contact hole increases. A related cost of fabrication and a final product increases with each mask.

The above references are incorporated by reference herein where appropriate for appropriate teachings of additional or alternative details, features and/or technical background.

SUMMARY OF THE INVENTION

An object of the invention is to solve at least the above problems and/or disadvantages and to provide at least the advantages described hereinafter.

Another object of the present invention is to provide a memory device and a method for fabricating the same that substantially obviates one or more of the problems caused by limitations and disadvantages of the related art.

Another object of the present invention is to provide a nonvolatile ferroelectric memory and a method for fabricating the same that reduces a device size.

Another object of the present invention is to provide a nonvolatile ferroelectric memory and a method for fabricating the same that increases an operational speed.

Another object of the present invention is to provide a nonvolatile ferroelectric memory device and a method for fabricating the same, in which a process margin is increased.

Another object of the present invention is to provide a nonvolatile ferroelectric memory device and a method for fabricating the same, in which the number of masks is reduced.

Another object of the present invention is to provide a nonvolatile ferroelectric memory device and a method for fabricating the same, in which a process margin is increased, which simplifies fabrication process steps.

Another object of the present invention is to provide a nonvolatile ferroelectric memory device and a method for fabricating the same, in which the number of masks is to reduced to reduce cost and minimize or reduce a layout area.

To achieve at least these objects and other advantages in whole or in part and in accordance with the purpose of the present invention, as embodied and broadly described, a memory includes first and second split wordlines formed on a substrate extending along a first direction separated by prescribed intervals, a first conductive layer that couples a second electrode of the first ferroelectric capacitor with a first active region at a first side of the second split wordline, a second conductive layer that couples a second electrode of the second ferroelectric capacitor with a second active region at a first side of the first split wordline, and first and second bitlines respectively coupled to the active regions at second sides of the respective split wordlines, wherein the second sides of the respective split wordlines are opposite the first sides.

To further achieve the above objects in a whole or in part, there is provided a memory according to the present invention that includes a semiconductor substrate having a first active region and a second active region spaced apart from each other and extending along a second direction, first and second split wordlines extending along a first direction across the first and second active regions, respectively, first and second impurity regions respectively formed in the first and second active regions at both sides of the first and second split wordlines, first plugs respectively coupled to the second impurity regions through contact holes, second plugs respectively coupled to the first impurity regions through the contract holes, first electrodes of first and second ferroelectric capacitors on the second and first split wordlines, respectively, first and second first ferroelectric layers on the first electrodes of the first and second ferroelectric capacitors, respectively, island shaped second electrodes of the first and second ferroelectric capacitors on surfaces of the first and second ferroelectric layers, respectively, first and second conductive layers respectively coupling the second plugs that are coupled to the first impurity regions with the second electrodes of the first and second ferroelectric capacitors, and first and second bitlines extending along the second direction to cross the first and second split wordlines that are respectively coupled to the first plugs that are respectively coupled to the second impurity regions.

To further achieve the above objects in a whole or in part, there is provided a method for fabricating a memory according to the present invention that includes defining a first active region and a second active region on a semiconductor substrate, forming first split wordline across the first active region and a second split wordline across the second active region, forming first and second source and drain regions in the first and second active regions, respectively, wherein the source and drain regions are at opposite sides of the first and second split wordlines, forming first plugs coupled to the first and second drain regions through a contact hole, forming second plugs coupled to the first and second source regions through the contract hole, respectively forming first electrodes of first and second ferroelectric capacitors over the second and first split wordlines, forming ferroelectric layers on the first electrodes, respectively forming island shaped second electrodes of the first and second ferroelectric capacitors on surfaces of the first and second ferroelectric layers, respectively forming first and second conductive layers that couple the second plugs with the second electrodes of the first and second ferroelectric capacitors, and forming first and second bitlines across the first and second split wordlines, wherein the first and second bitlines are coupled to the first and second drain regions through the first plugs.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIG. 4a illustrates a related art nonvolatile ferroelectric memory;

FIG. 4b illustrates a cross-section along line I–I' of the related art nonvolatile ferroelectric memory in FIG. 4a;

FIGS. 10a to 10i are diagrams that illustrate layouts of a memory device according to the preferred embodiment of FIG. 9;

DETAILED DESCRIPTION OF PREFERRED EMBODIMENTS

Figure 1:
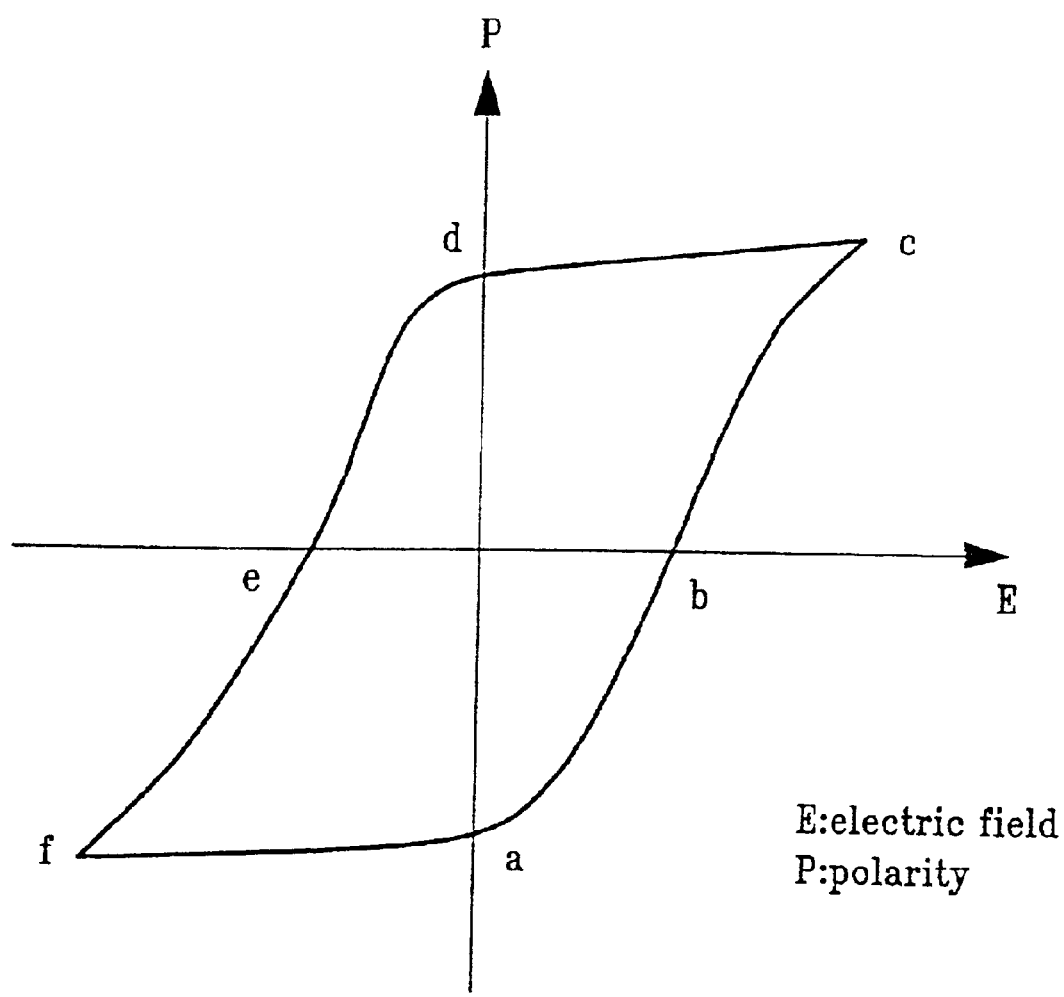
FIG. 1 illustrates a characteristic curve of a hysteresis loop of a ferroelectric.
Figure 2:
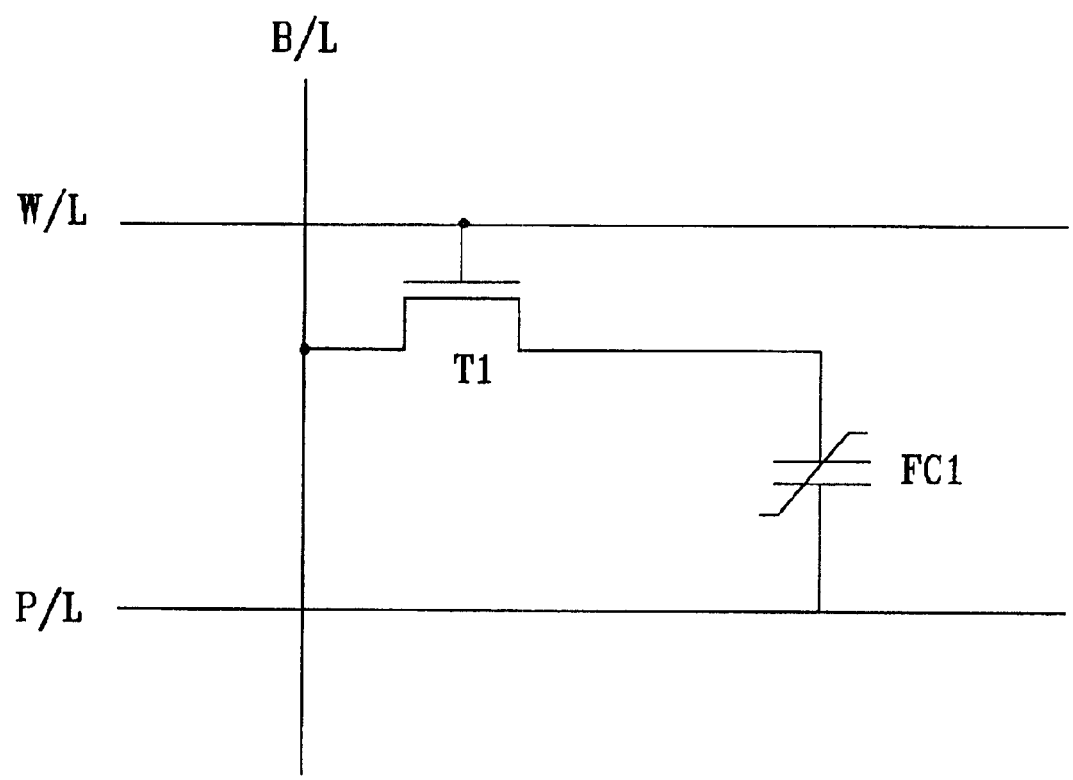
FIG. 2 illustrates a schematic view of a unit cell of a related art non-volatile ferroelectric memory unit cell.
Figure 3A:
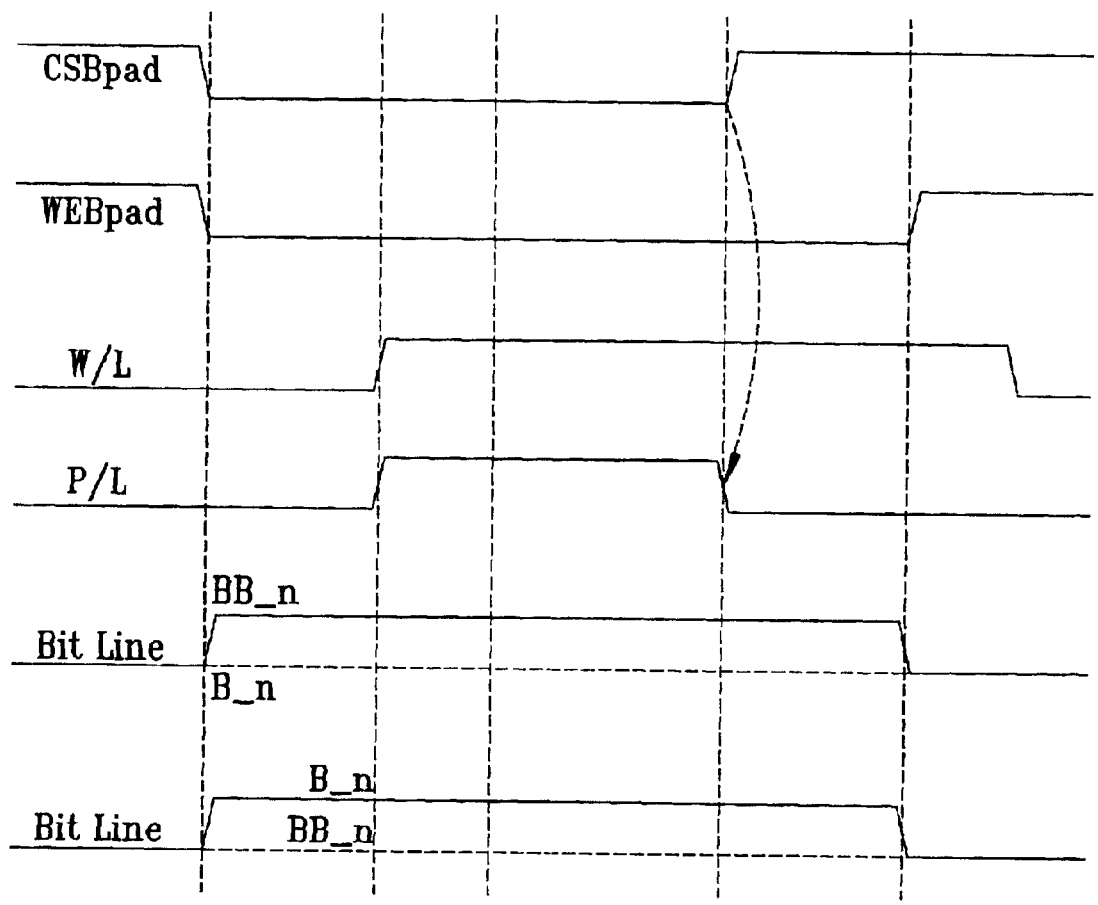
FIG. 3a illustrates a timing diagram of a write mode operation of the related art nonvolatile ferroelectric memory.
Figure 3B:
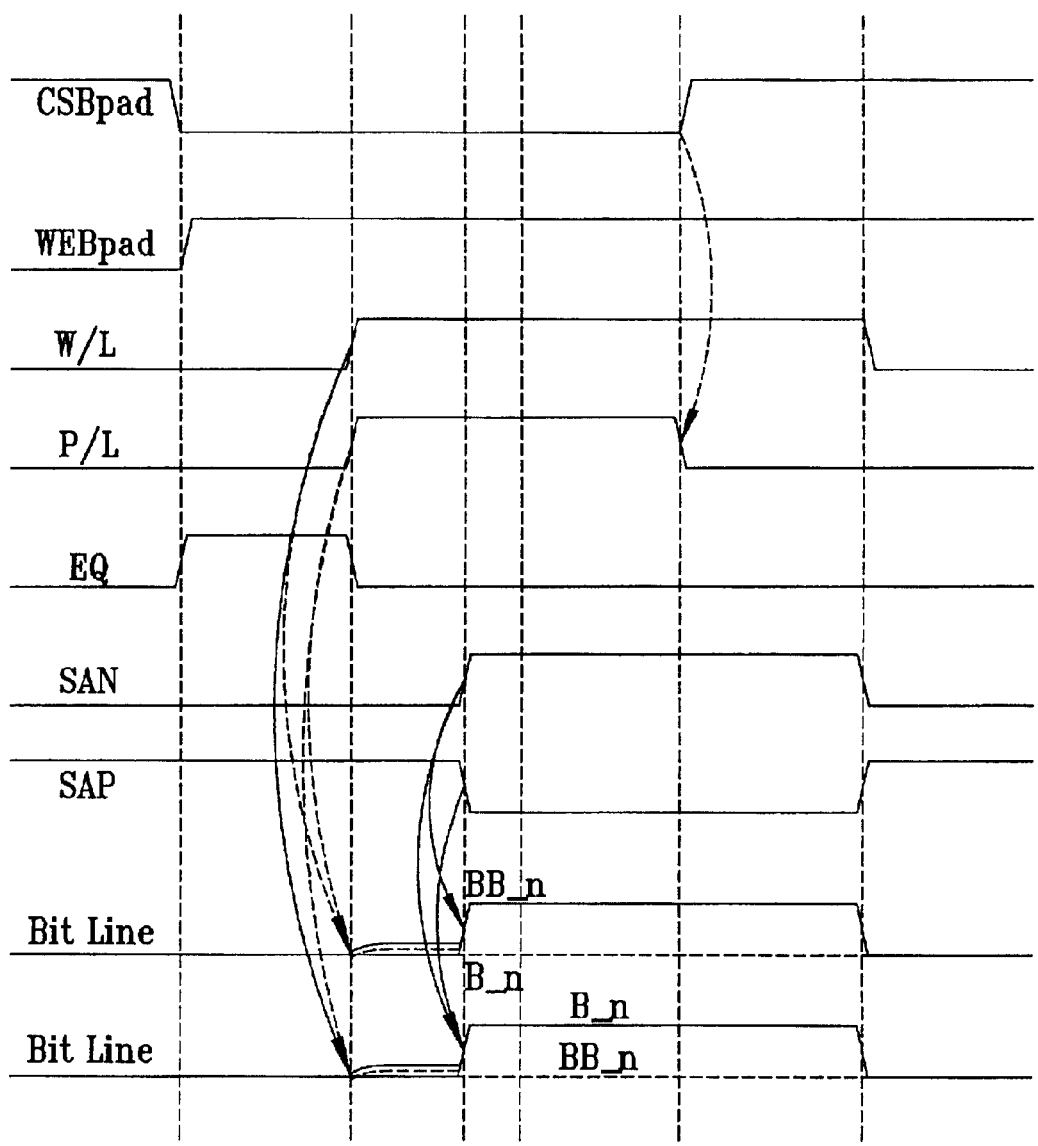
FIG. 3b illustrates a timing diagram of a read mode operation of the related art nonvolatile ferroelectric memory.
Figure 4B:
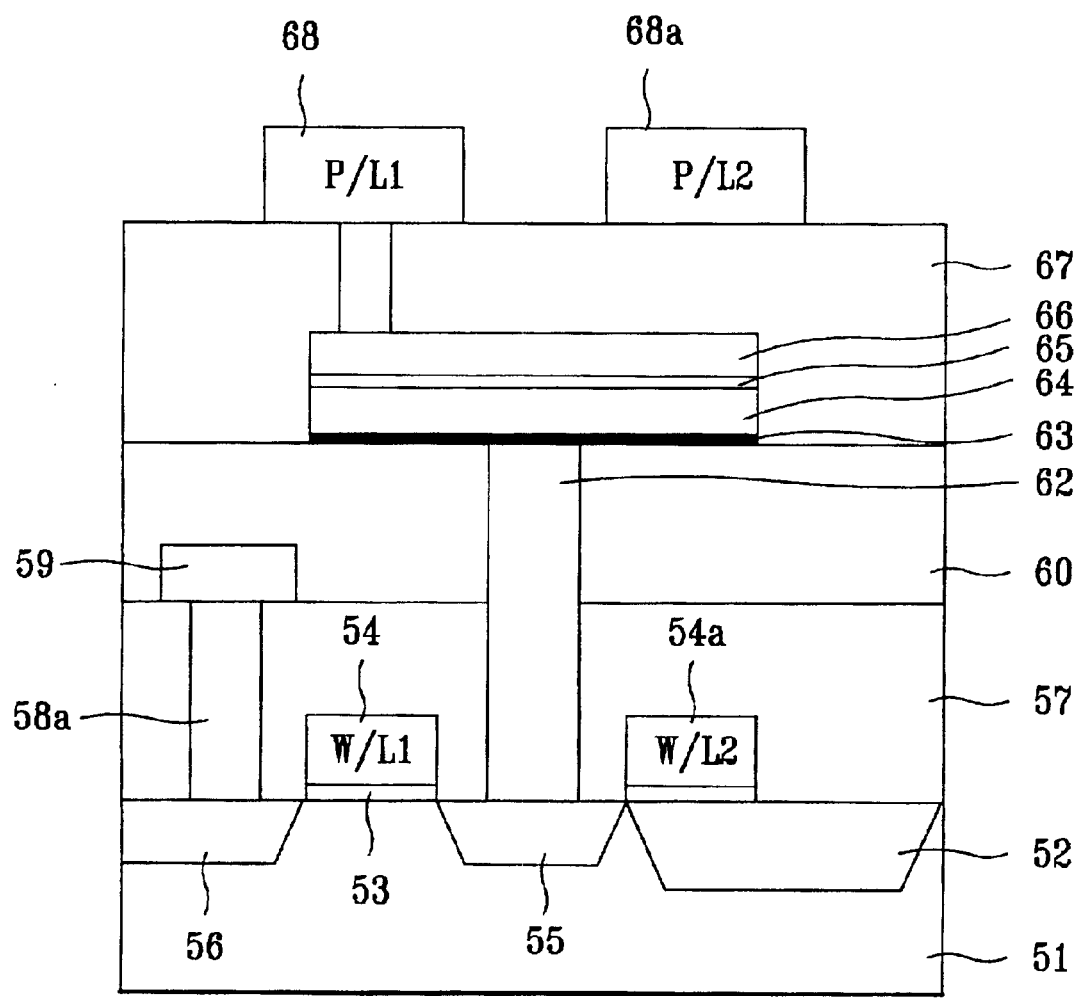
Figure 5A:
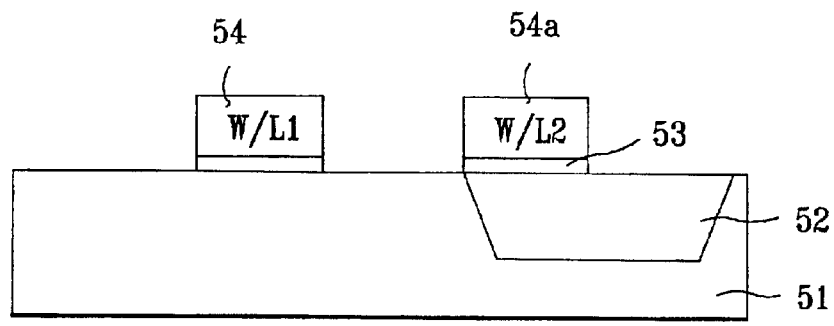
FIGS. 5a~5f illustrate cross-sections along line I–I' in FIG. 4a for describing a method for fabricating the related art nonvolatile ferroelectric memory.
Figure 5B:
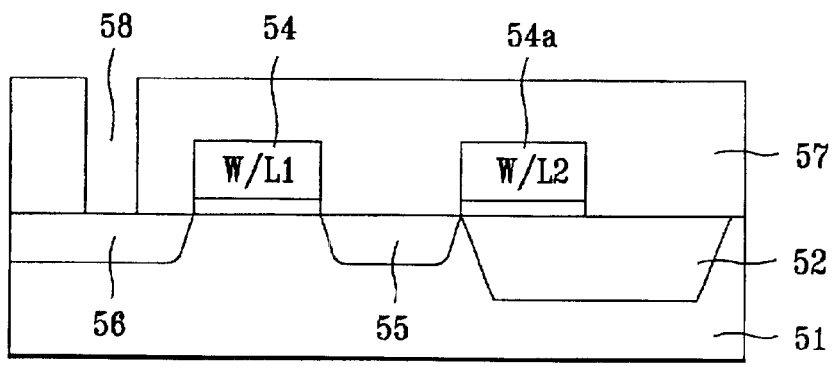
Figure 5C:
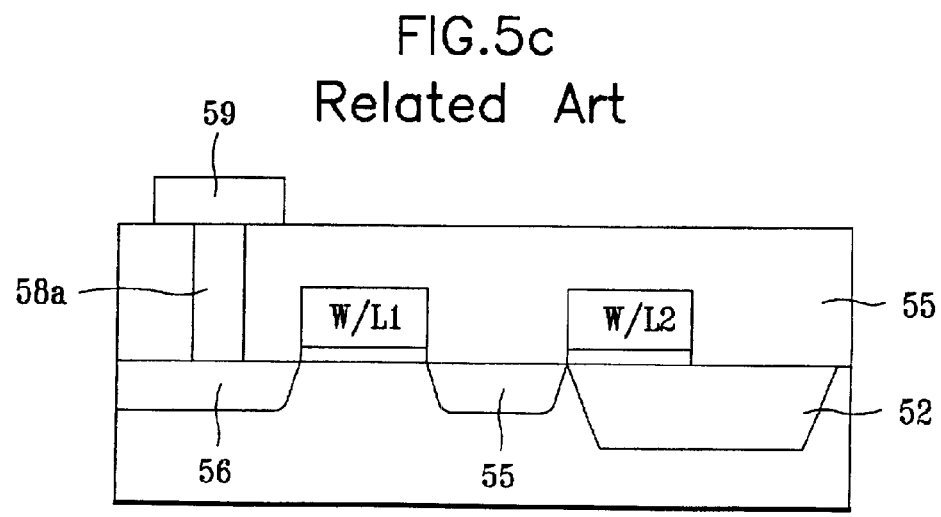
Figure 5D:
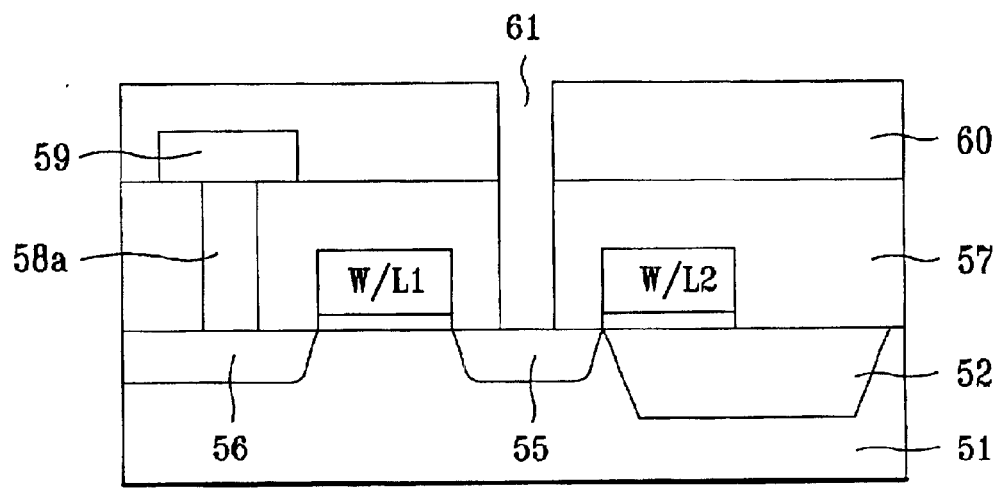
Figure 5E:
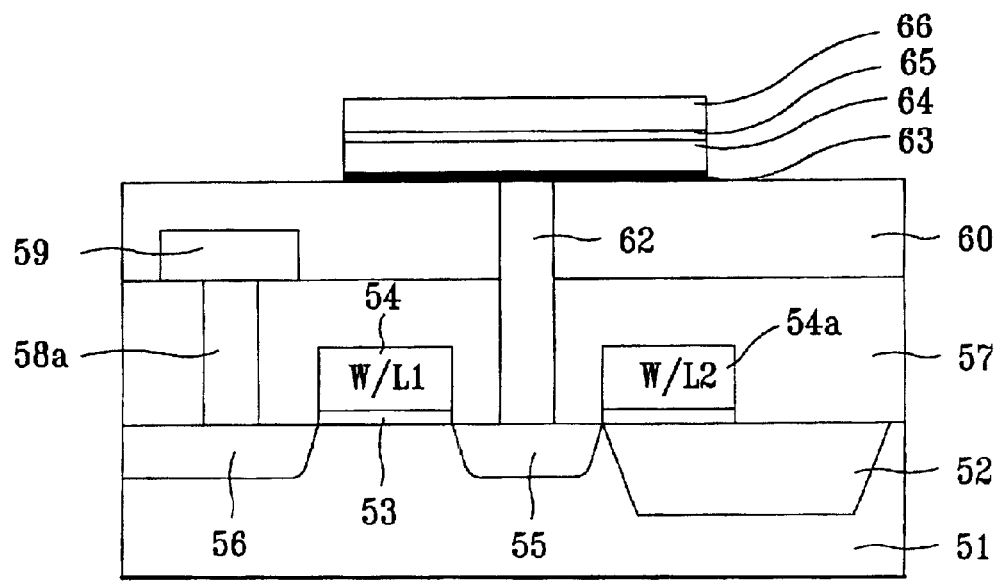
Figure 5F:
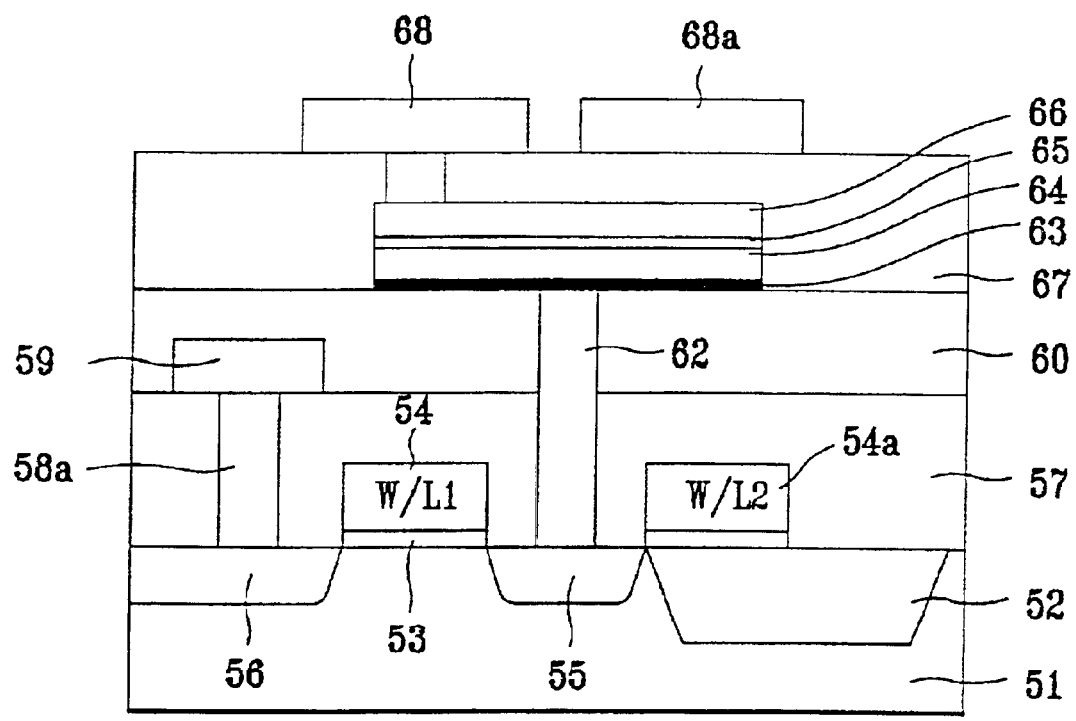
Figure 6:
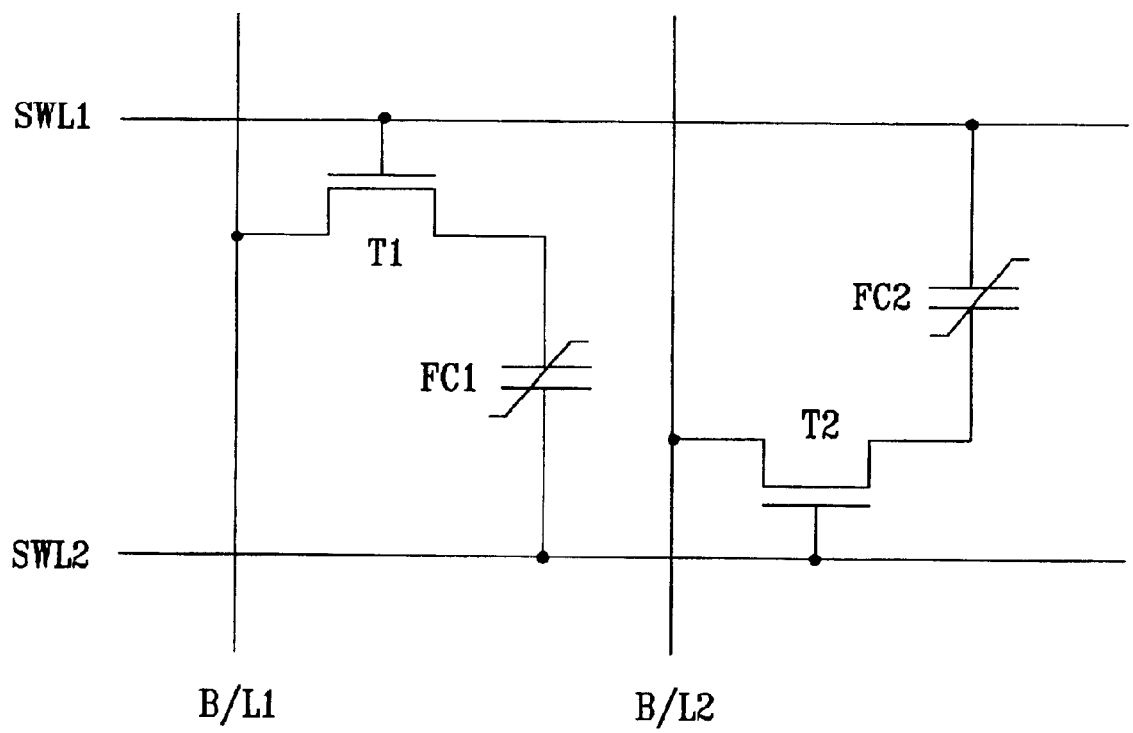
FIG. 6 is a diagram that illustrates a ferroelectric memory unit cell in accordance with preferred embodiments of the present invention.

FIG. 6 is a schematic view showing a unit cell of a nonvolatile ferroelectric memory device according to preferred embodiments of the present invention. As shown in FIG. 6, a unit cell of the nonvolatile ferroelectric memory device includes first and second split wordlines SWL1 and SWL2 formed with a prescribed interval in a row direction, and first and second bitlines B/L1 and B/L2 formed across and preferably substantially perpendicular to the first and second split wordlines SWL1 and SWL2. A first transistor T1 has a gate coupled with the first split wordline SWL1 and drain coupled with the first bitline B/L1. A first ferroelectric capacitor FC1 is coupled between a source of the first transistor T1 and the second split wordline SWL2. A second transistor T2 has a gate coupled with the second split wordline SWL2 and drain coupled with the second bitline B2, and a second ferroelectric capacitor FC2 is coupled between a source of the second transistor T2 and the first split wordline SWL1. A plurality of the unit cells constitute a cell array.

Figure 7:
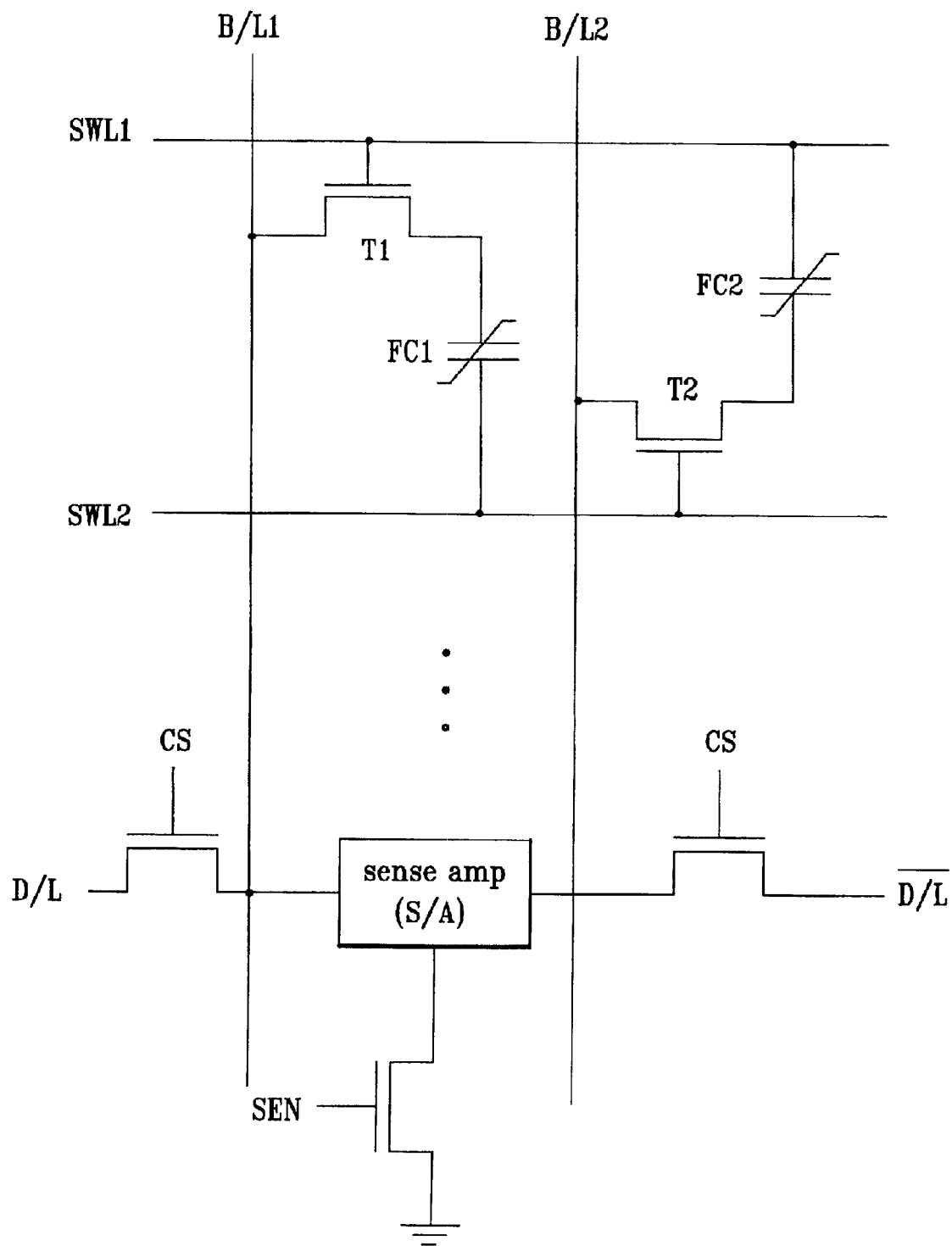
FIG. 7 is a diagram that illustrates a block diagram of preferred embodiments of a ferroelectric memory according to the present invention.

Operations of the nonvolatile ferroelectric memory device will now be described. FIG. 7 is a circuit diagram showing a nonvolatile ferroelectric memory device according to preferred embodiments of the present invention.

As shown in FIG. 7, a plurality of split wordline pairs including first and second split wordlines SWL1 and SWL2 in pairs are preferably formed in row direction. A plurality of bitlines B/L1 and B/L2 are formed across the split wordline pairs. Sensing amplifiers SA are formed between the respective bitlines to sense data transmitted through the bitlines and transfer the sensed data to a data line DL or a data bar line /DL. At this time, a sensing amplifier enable portion and a selection switching portion are provided (not shown). The sensing amplifier enable portion outputs a sensing amplifier enable signal SEN to enable the sensing amplifiers SA, and the selection switching portion selectively switches bitlines and data lines and can use a column selection signal CS.

Operations of a nonvolatile ferroelectric memory device according to preferred embodiments of the present invention will be described with reference to a timing chart shown in FIG. 8.

Figure 8:
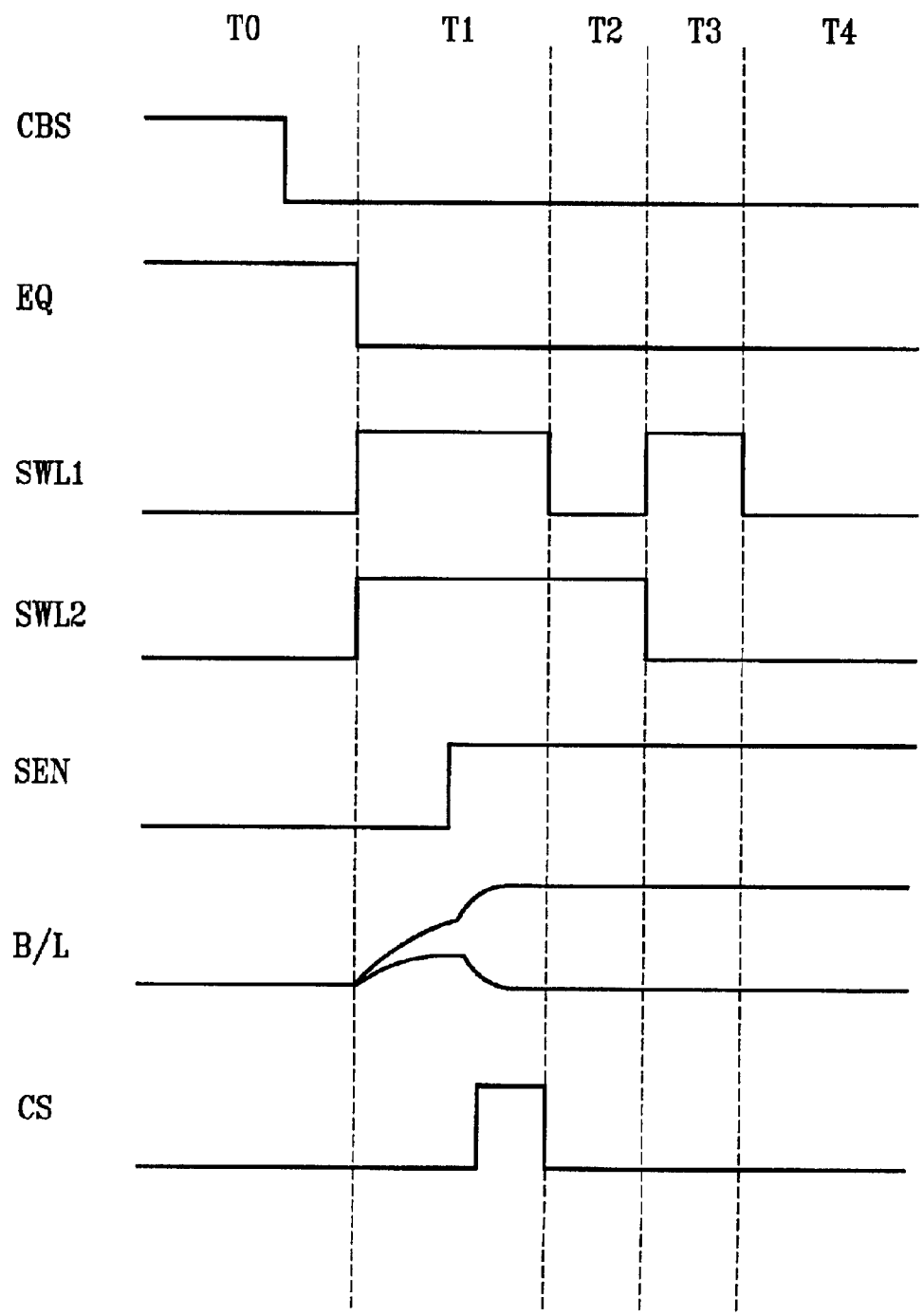
FIG. 8 is a diagram that illustrates a timing diagram for operations of preferred embodiments of a ferroelectric memory according to the present invention.

A T0 period in FIG. 8 denotes a period before the first split wordline SWL1 and the second split wordline SWL2 are activated to "high(H)". In this T0 period, all of bitlines are preferably precharged at a threshold voltage level of an NMOS transistor.

A T1 period denotes a period that the first and second split wordlines SWL1 and SWL2 are all to become "H". In this T1 period, data of the ferroelectric capacitor in the main cell are transmitted to the main bitline so that the bitline level is varied.

At this time, in case of the ferroelectric capacitor having a logic value "high", since electric fields having opposite polarities are applied to the bitline and the split wordline, the polarity of the ferroelectric is destroyed so that a large amount of current flows. Thus, a high voltage in the bitline is induced. By contrast, in case of the ferroelectric capacitor having a logic value "low", since electric fields having the same polarities are applied to the bitline and the split wordline, polarity of the ferroelectric is not destroyed so that a small amount of current flows. Thus, a low voltage is induced in the bitline.

If the cell data are loaded in the bitline sufficiently, the sensing amplifier enable signal SEN is transited to high so as to activate the sensing amplifier. As a result, the bitline level is amplified.

Since the logic data "H" of the destroyed cell can not be restored at the state that the first and second split wordlines SWL1 and SWL2 are high, the data can be restored in T2 and T3 periods. Subsequently, in T2 period, the first split wordline SWL1 is transited to low, the second split wordline SWL2 is maintained at high level, and the second transistor T2 is turned on. At this time, if the corresponding bitline is high, high data is transmitted to one electrode of the second ferroelectric capacitor FC2 so that the logic value "1" is restored.

In the T3 period, the first split wordline SWL1 is transited to high, the second split wordline SWL2 is transited to low, and the first transistor T1 is turned on. At this time, if the corresponding bitline is high, high data is transmitted to one electrode of the first ferroelectric capacitor FC1 so that logic value "1" is restored.

Figure 9:
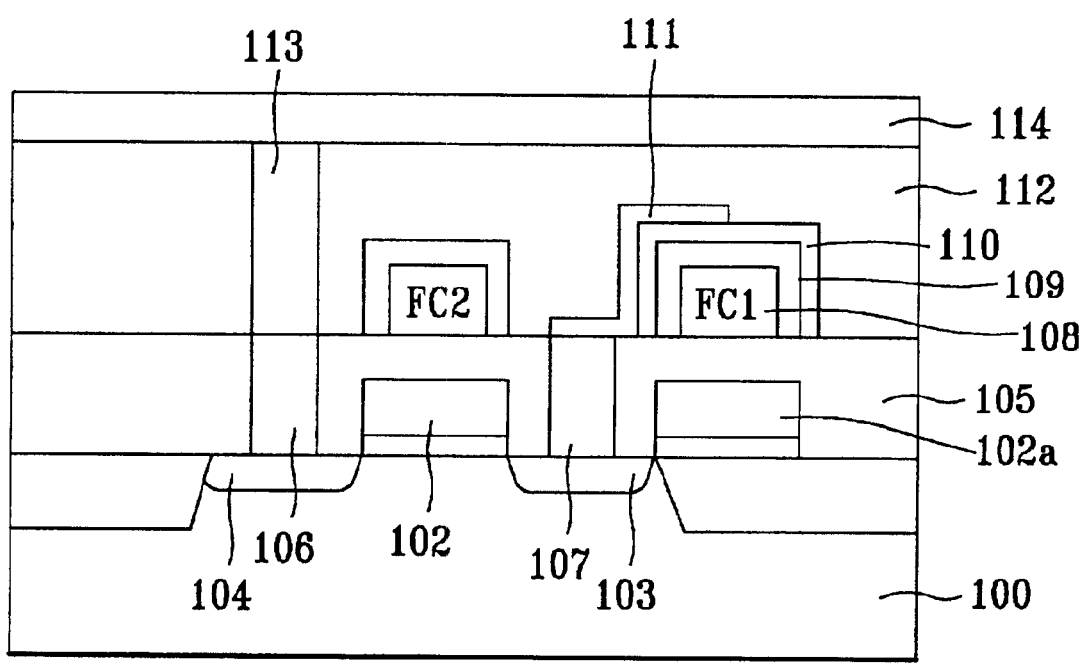
FIG. 9 is a diagram that shows a cross-sectional view illustrating a memory device according to a preferred embodiment of the present invention.

FIG. 9 is a diagram that shows a sectional view illustrating a nonvolatile ferroelectric memory device according to a first preferred embodiment of the present invention. As shown in FIG. 9, the first preferred embodiment of the nonvolatile ferroelectric memory device includes a semiconductor substrate 100 in which an active region and a field region are defined. A first split wordline 102 is on the semiconductor substrate of the active region, while a second split wordline 102a is on the semiconductor substrate of the field region. First source and drain regions 103 and 104 are in the substrate at both sides of the first split wordline 102. Second source and drain regions 103a and 104a (not shown) are in the substrate at both sides of the second split wordline 102a. A first plug 106 is coupled to the first drain region 104 through a first insulating layer 105. A second drain region 104a and a first plug 106 coupled to the second drain region 104a are not shown. A second plug 107 is coupled to the first source region 103 through the first insulating layer 105. A second source region 103a and a second plug 107 coupled to the second source region are not shown. A first electrode 108a of a second ferroelectric capacitor FC2 is on the first insulating layer 105 on the first split wordline 102, while a first electrode 108 of a first ferroelectric capacitor FC1 is on the first insulating layer 105 on the second split wordline 102a. A first ferroelectric layer 109 is on the first electrode 108 of the first ferroelectric capacitor while a second ferroelectric layer 109a (not shown) is on the first electrode 108a of the second ferroelectric capacitor. A second electrode 110 of the first ferroelectric capacitor and a second electrode 110a (not shown) of the second ferroelectric capacitor are asymmetrically formed on the first and second ferroelectric layers 109 and 109a, respectively, in parallel to each other along the first and second split wordlines. A first conductive layer 111 is electrically coupled to the second electrode 110 of the first ferroelectric capacitor FC1 and the second plug 107 coupled to the first source region 103. A second conductive layer 111a (not shown) is electrically coupled to the second electrode of the second ferroelectric capacitor FC2 and the second plug coupled to the source region. A second insulating layer 112 is on an entire surface including the first and second conductive layers. A third plug 113 is coupled to the first plug 106 through the second insulating layer 112. A first bitline 114 extends across the first and second split wordlines 102 and 102a and coupled to the third plug 113. A second bitline 114a (not shown) extends across the first and second split wordlines 102 and 102a and is coupled to the third plug 113. A barrier layer is further formed between the first plugs and the second electrodes of the ferroelectric capacitors.

The second electrode 110 of the first ferroelectric capacitor FC1 is preferably coupled to the source region (first source region) of a first transistor T1 while the second electrode 110a of the second ferroelectric capacitor FC2 is preferably coupled with a source region (second source region) of a second transistor (e.g., T2).

Figure 10A:
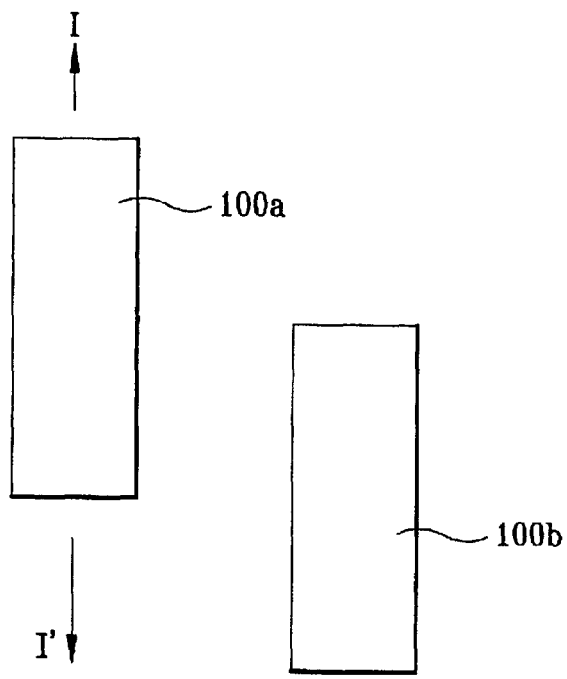

A layout process of the nonvolatile ferroelectric memory device according to a first preferred embodiment of the present invention will now be described with reference to FIGS. 10a to 10i. As shown in FIG. 10a, a first active region 100a and a second active region 100b are defined on a first conductive type semiconductor substrate at a prescribed interval and asymmetrically spaced but parallel to each other. A field region (device isolation layer) 100c is formed on the semiconductor substrate other than the active regions 100a and 100b preferably by a trench isolation process.

Figure 10B:
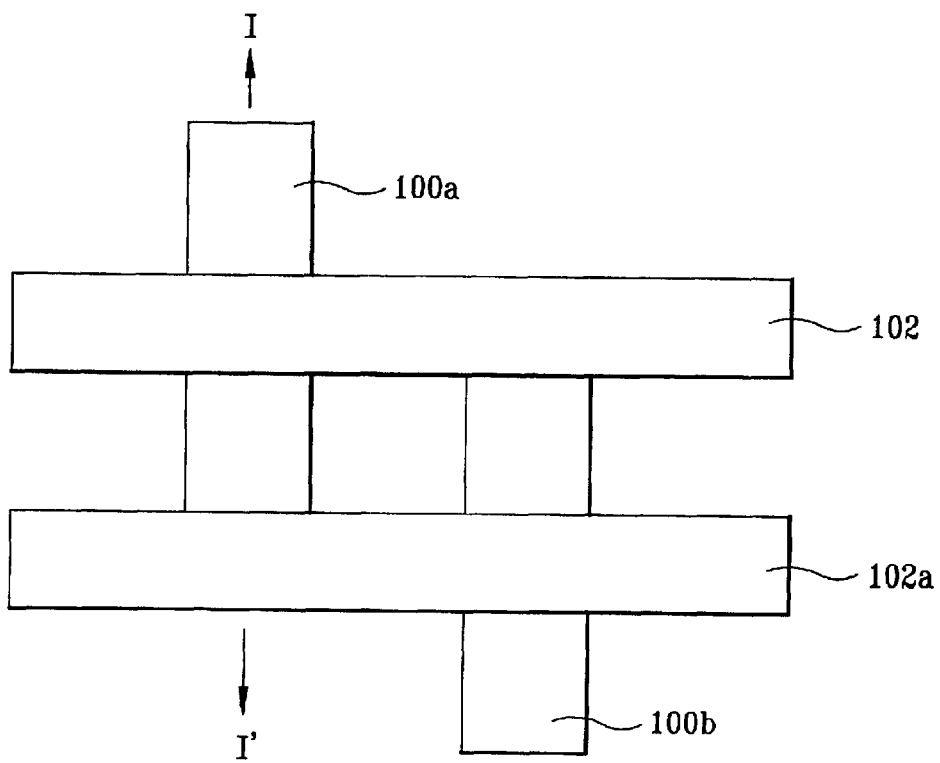

As shown in FIG. 10b, first and second split wordlines (SWL1) 102 and (SWL2) 102a are formed across the active regions to divide each of the active regions 100a and 100b into two. At this time, the first split wordline 102 becomes a gate electrode of the first transistor T1 while the second split wordline 102a becomes a gate electrode of the second transistor T2. Subsequently, impurity ions of a conductivity type opposite to the substrate are implanted into the substrate at both sides of the first split wordline 102 to form first source and drain regions (not shown). Second source and drain regions are preferably formed in the substrate at both sides of the second split wordline 102a at the same time.

Figure 10C:
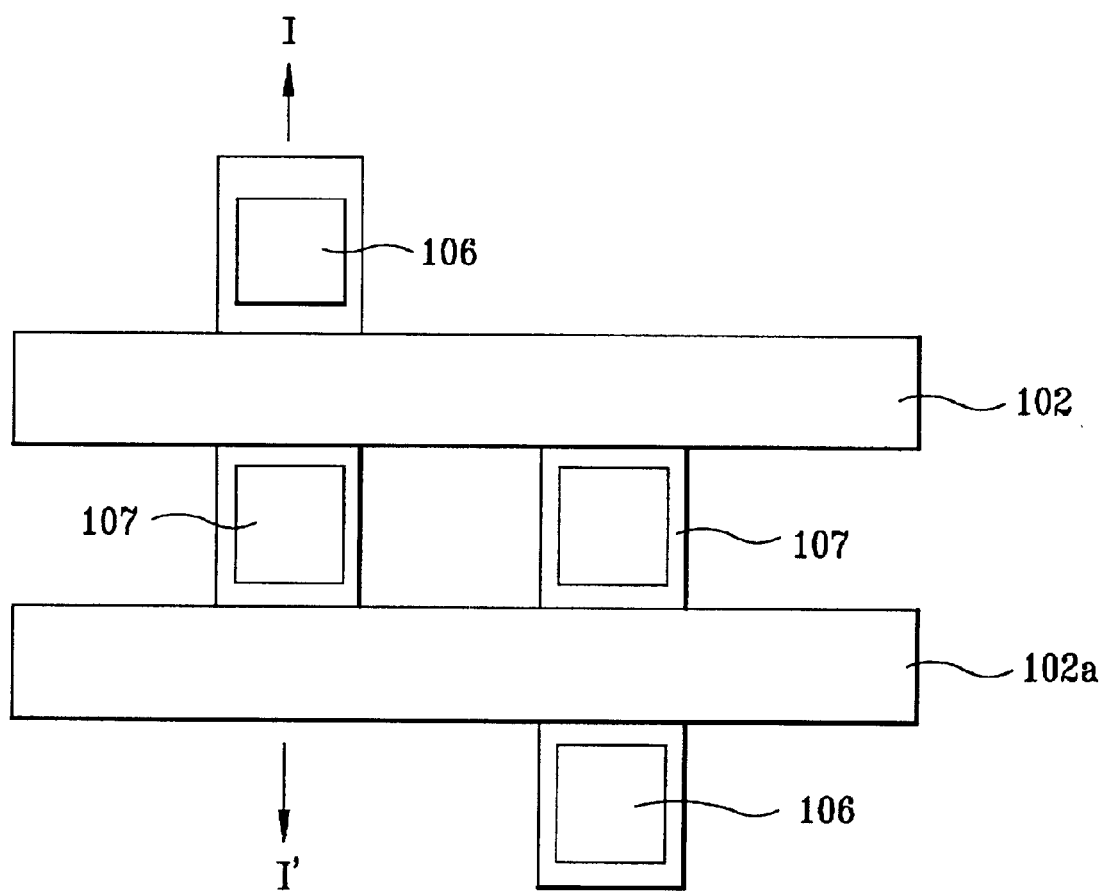

As shown in FIG. 10c preferably after a first insulating layer 105 (not shown), the first plugs 106 are formed to be respectively coupled to the first and second drain impurity regions. Also, the second plugs 107 are formed to be respectively coupled to the first and second source impurity regions.

Figure 10D:
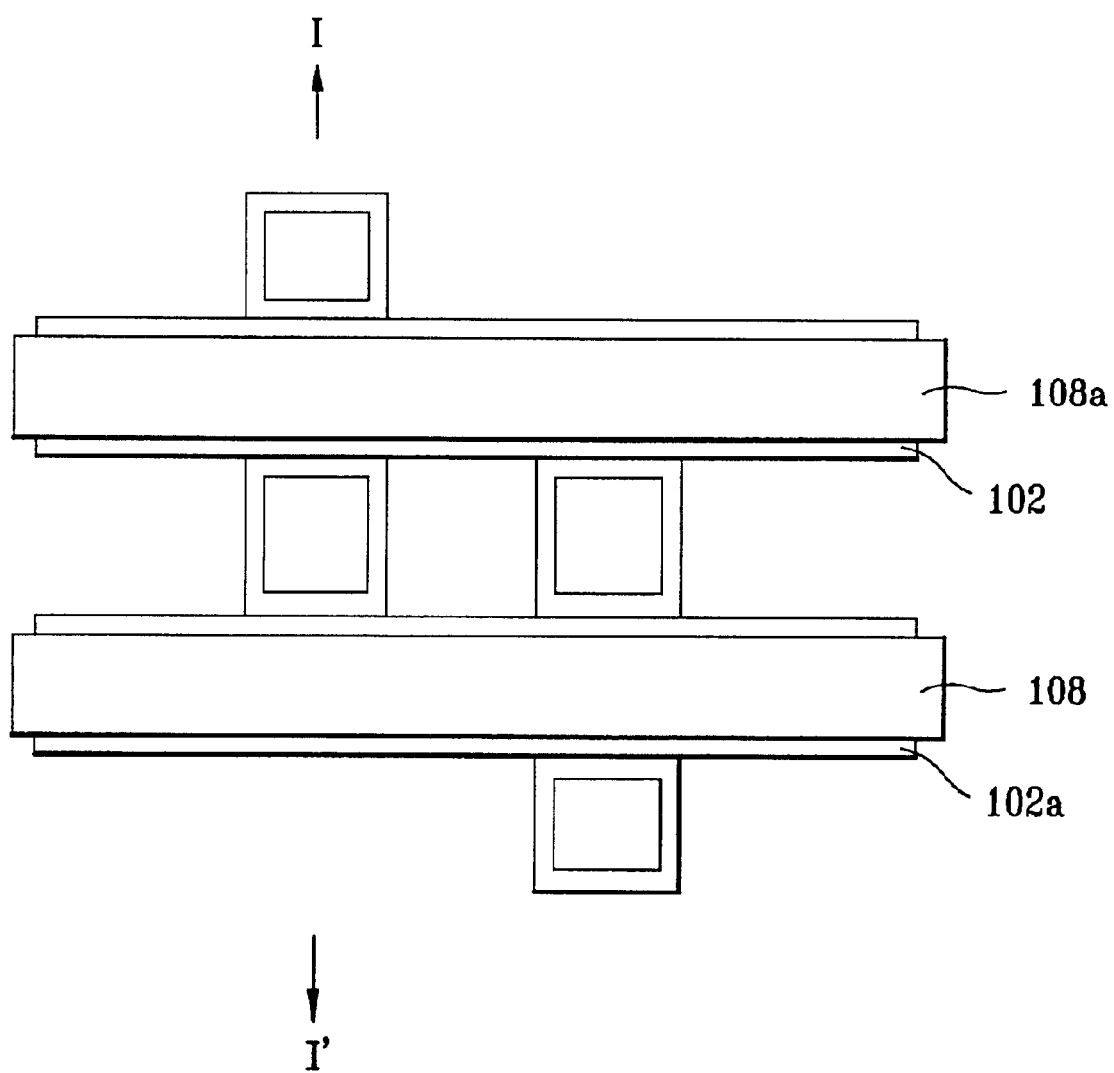

As shown in FIG. 10d, the first electrode 108a of the second ferroelectric capacitor FC2 is formed on the first split wordline 102 while the first electrode 108 of the first ferroelectric capacitor FC1 is formed on the second split wordline 102a. At this time, the first electrodes 108 and 108a of the first and second ferroelectric capacitors preferably have widths smaller than or equal to the first and second split wordlines.

The first electrode 108 of the first ferroelectric capacitor FC1 is preferably electrically coupled to the second split wordline SWL2 while the first electrode 108a of the second ferroelectric capacitor FC2 is electrically coupled to the first split wordline SWL1.

Figure 10E:
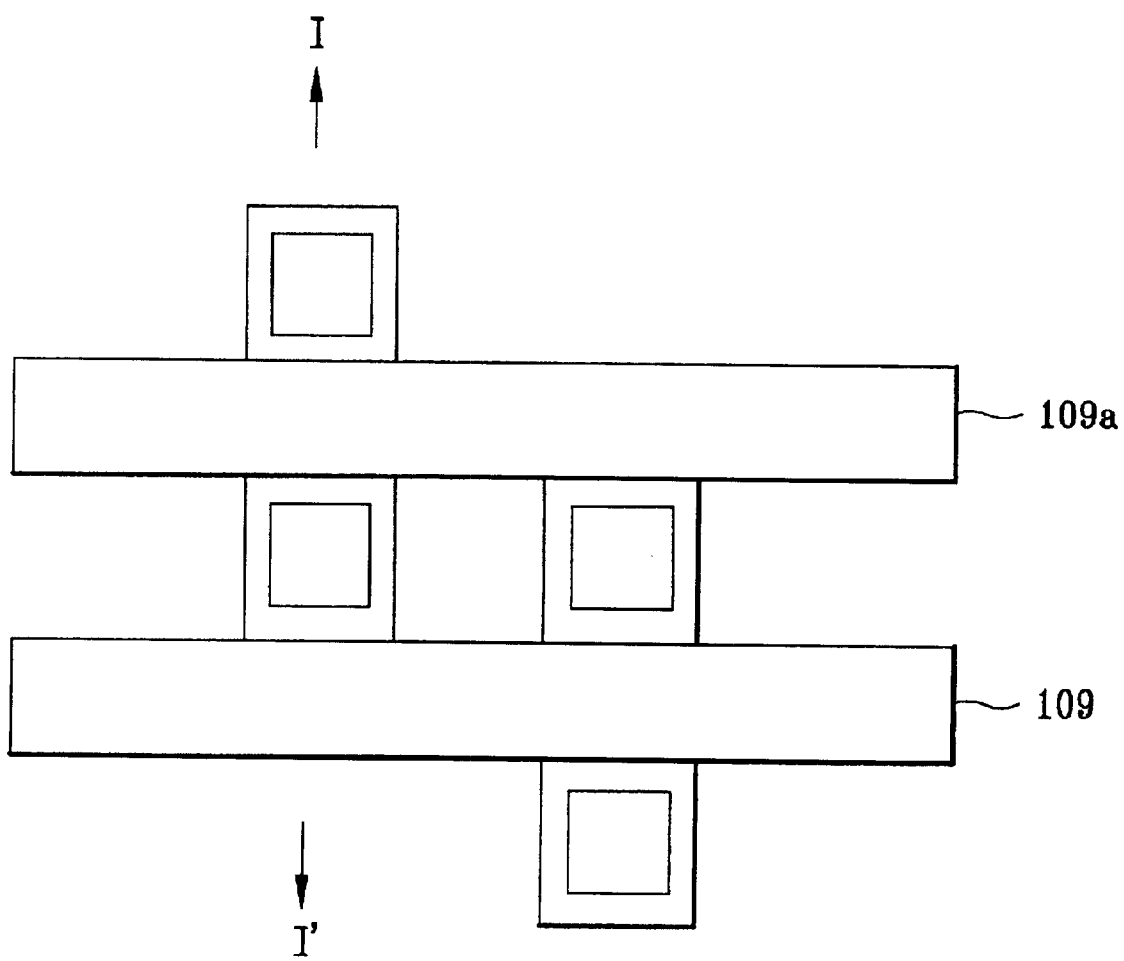

As shown in FIG. 10e, the first ferroelectric layer 109 is formed on the first electrode 108 of the first ferroelectric capacitor while the second ferroelectric layer 109a is formed on the first electrode 108a of the second ferroelectric capacitor. That is to say, the ferroelectric layers 109 and 109a are preferably formed on the entire surface including the first electrodes 108 and 108a of the first and second ferroelectric capacitors and then patterned to remain on the first electrode of the first ferroelectric capacitor and the first electrode of the second ferroelectric capacitor.

As shown in FIG. 10f, a second electrode material of the ferroelectric capacitors is deposited on the entire surface including the first and second ferroelectric layers 109 and 109a. The second electrode material is then preferably patterned so that the second electrode 110 of the first ferroelectric capacitor is formed on the first ferroelectric layer 109 at one side of the second active region 100b, and the second electrode 110a of the second ferroelectric capacitor is formed on the second ferroelectric layer 109a at one side of the first active region 100a.

At this time, the first and second electrodes 110 and 110a of the first and second ferroelectric capacitors are patterned to remain on the field region. That is to say, the second electrodes of the ferroelectric capacitors are formed on the field region at both sides of the active region by etching the second electrode material of the ferroelectric capacitor formed on the active region.

Figure 10G:
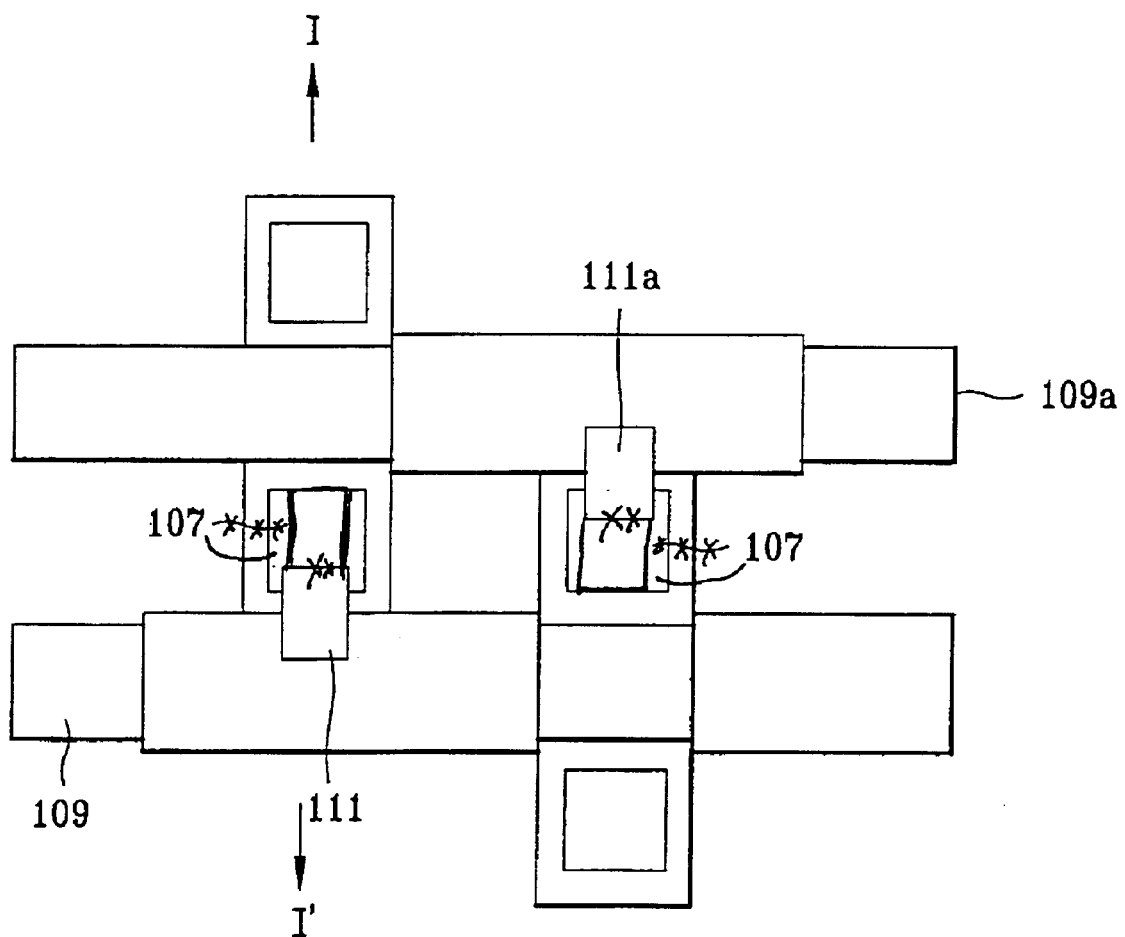

As shown in FIG. 10g, the first conductive layer 111 and the second conductive layer 111a are formed. The first conductive layer 111 preferably electrically coupled the second plug 107 coupled to the first source region 103 with the second electrode 110 of the first ferroelectric capacitor FC1. The second conductive layer 111a electrically couples the second plug 107 coupled to the second source region 103a with the second electrode 110a of the second ferroelectric capacitor.

The second electrode of the ferroelectric capacitor is preferably divided by the active region, so that a process margin can be ensured when the first conductive layer 111 and the second conductive layer 111a are formed. In other words, since the second active region is asymmetrically spaced apart from the first active region, the second electrodes are formed at both sides of the active regions. Accordingly, the first and second conductive layers need not to be adjacent to each other, which obtains the process margin.

Furthermore, when the first and second conductive layers 111 and 111a are formed, the second electrode of the ferroelectric capacitor is directly coupled to the second plug, not through a contact hole. Thus, the process can be simplified.

Figure 10H:
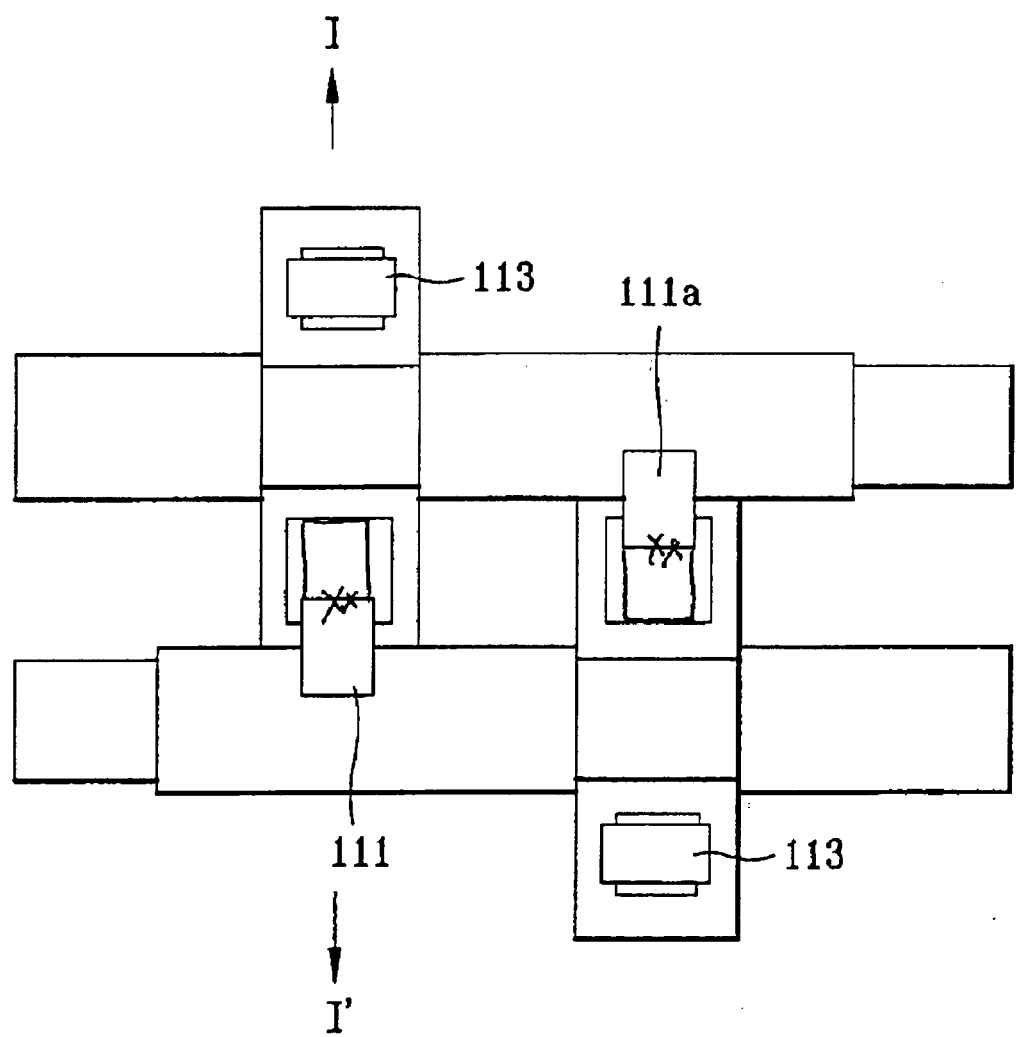

Subsequently, as shown in FIG. 10h, the second insulating layer 112 (not shown) is formed on the entire surface including the first and second conductive layers 111 and 111a and then preferably planarized by chemical mechanical polishing (CMP) process or the like. The third plug 113 is then formed to be respectively coupled to the first plugs 106 respectively coupled with the first and second drain regions 104 and 104a.

Figure 10I:
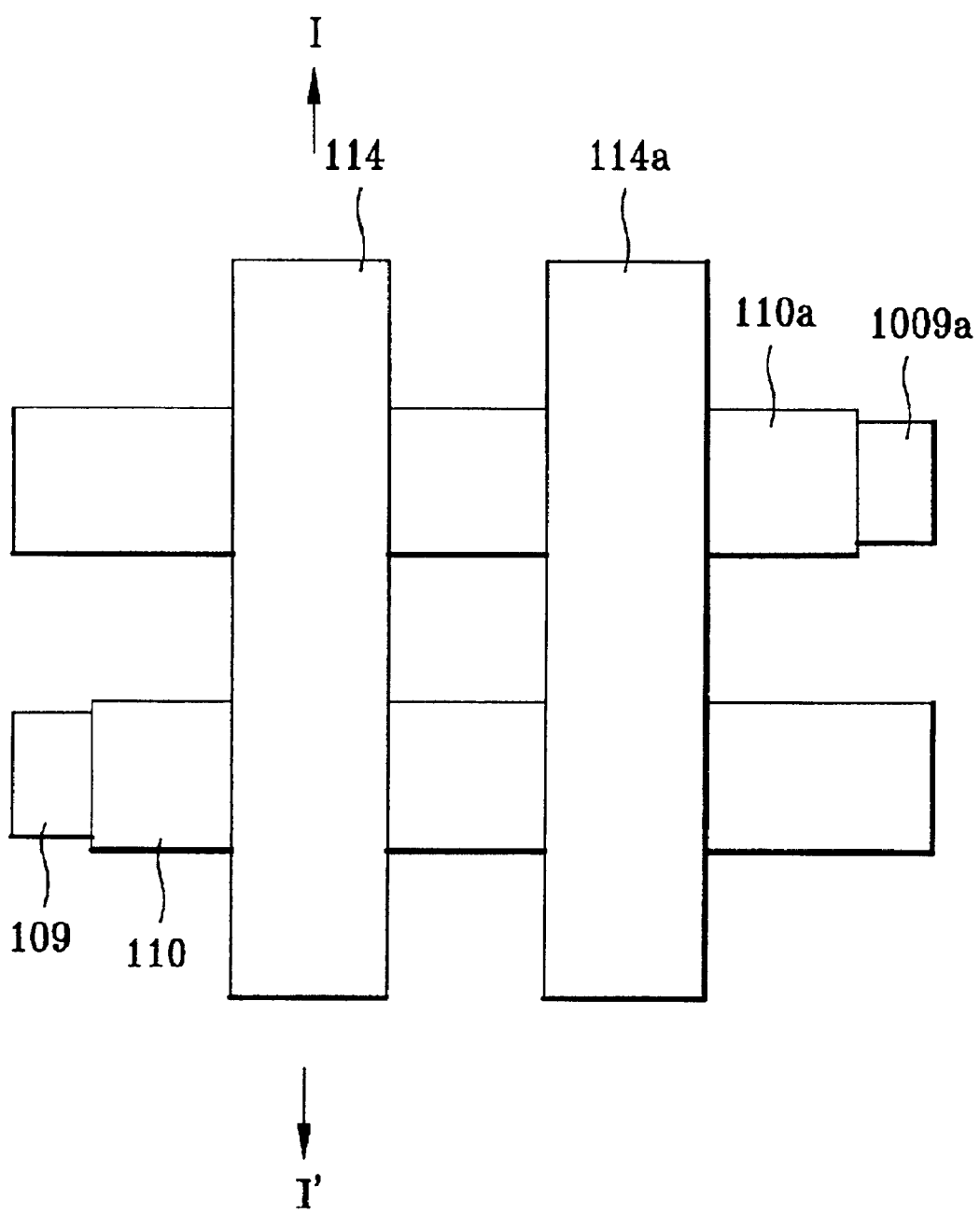

As shown in FIG. 10i, the first bitline 114 and the second bitline 114a are formed across the first and second split wordlines 102 and 102a. The first bitline 114 is electrically coupled with the third plug 113 coupled to the first drain region 104. The second bitline 114a is electrically coupled with the third plug 113 coupled to the second drain region 104a. Thus, the layout process of the first preferred embodiment of the nonvolatile ferroelectric memory device according to the present invention is completed.

A first preferred embodiment of a method for fabricating a nonvolatile ferroelectric memory device according to the present invention will now be described with reference to FIGS. 11a to 11i. The first preferred embodiment of a process for fabricating a nonvolatile ferroelectric memory device can be used, for example, to fabricate the first preferred embodiment of the nonvolatile ferroelectric memory device.

Figure 11A:
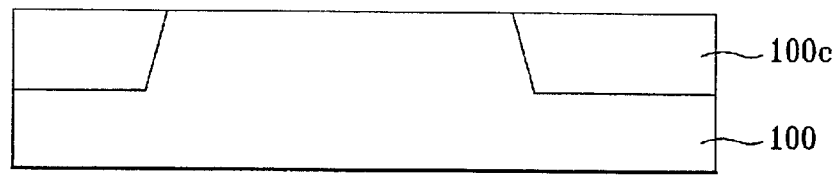
FIGS. 11a to 11i are diagrams that illustrate sections along line I–I' in FIGS. 10a to 10i, respectively, of a preferred embodiment of a method for fabricating a memory device in accordance with the present invention.

As shown in FIG. 11a, the semiconductor substrate 100 is defined as the active regions 100a and 100b and the field region 100c. The field region is preferably formed by a trench isolation process.

Figure 11B:
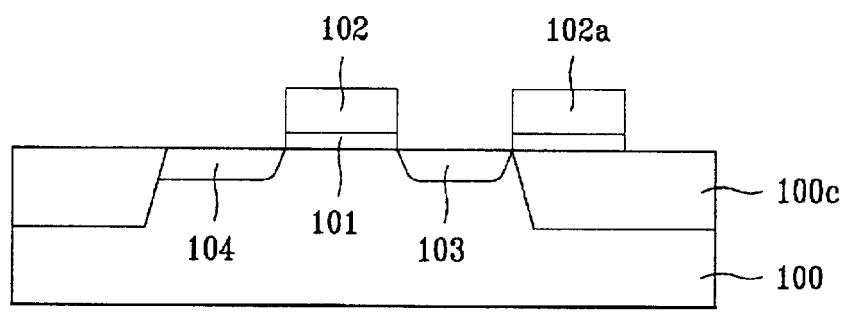

As shown in FIG. 11b, the first split wordline 102 and the second split wordline 102a are formed on a gate insulating layer 101 formed on the active regions and the field region. The first split wordline 102 is preferably used as the gate electrode of the first transistor T1 while the second split wordline 102a is preferably used as the gate electrode of the second transistor T2. Thereafter, the impurity ions are implanted into the substrate using the first and second split wordlines 102 and 102a as masks. Thus, the first source and drain regions 103 and 104 and the second source and drain regions (not shown) are formed. The first source and drain regions 103 and 104 will be used as source and drain of the first transistor T1 while the second source and drain regions will be used as source and drain of the second transistor T2.

Figure 11C:
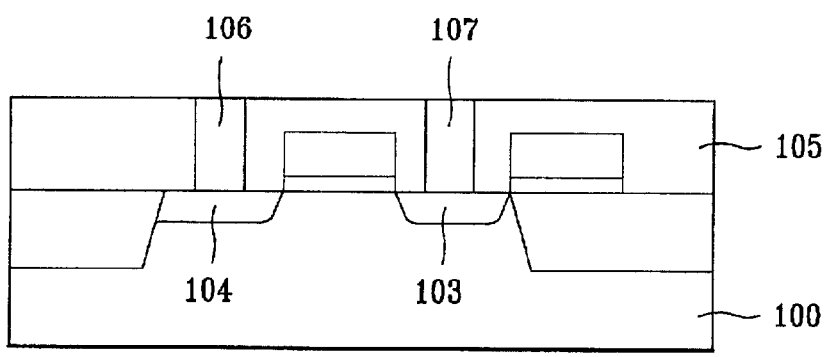

As shown in FIG. 11c, the first insulating layer 105 is formed on the entire surface of the substrate including the first and second split wordlines 102 and 102a. At this time, an Inter Layer Dielectric (ILD) layer is preferably used as the insulating layer 105. Thereafter, the first insulating layer 105 is planarized by CMP process. The first insulating layer 105 is then patterned to expose the first and second source regions 103 and 103a and the first and second drain regions 104 and 104a, so that a contact hole is respectively formed. A polysilicon or a metal such as tungsten is buried in the contact hole to form the first plugs 106 and the second plugs 107. The first plugs 106 are coupled to the first and second drain regions 104 and 104a (not shown), which are used as drains of the first and second transistors T1 and T2. The second plugs 107 are coupled to the first and second source regions 103 and 103a (not shown), which are used as sources of the first and second transistors T1 and T2. A polysilicon or metal such as tungsten is preferably used as the plugs.

Figure 11D:
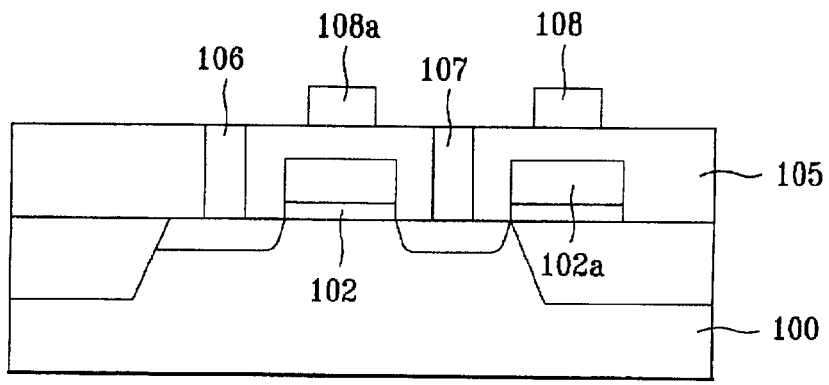

As shown in FIG. 11d, the first electrode material of the ferroelectric capacitor is formed on the entire surface including the plugs and then patterned to remain on the first and second split wordlines 102 and 102a. Thus, the first electrode 108a of the second ferroelectric capacitor is formed on the first split wordline 102 and the first electrode 108 of the first ferroelectric capacitor is formed on the second split wordline 102a. Before forming the first electrodes, a barrier layer may be formed.

Figure 11E:
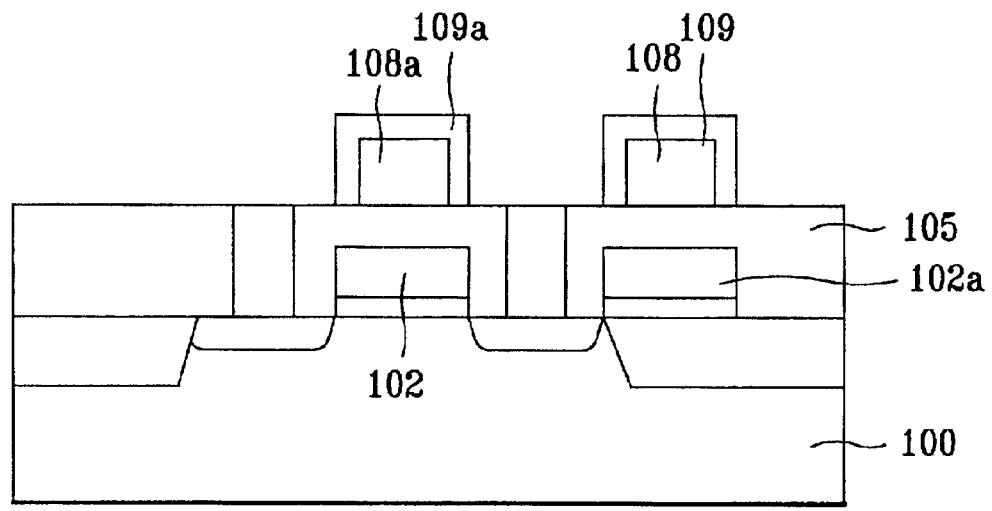

As shown in FIG. 11e, the first ferroelectric layer 109 is formed on the surface of the first electrode 108 of the first ferroelectric capacitor, and the second ferroelectric layer 109a is formed on the surface of the first electrode 108a of the second ferroelectric capacitor. Preferably, the ferroelectric layers are formed to surround the upper surfaces and both sides of the first electrodes.

Figure 11F:
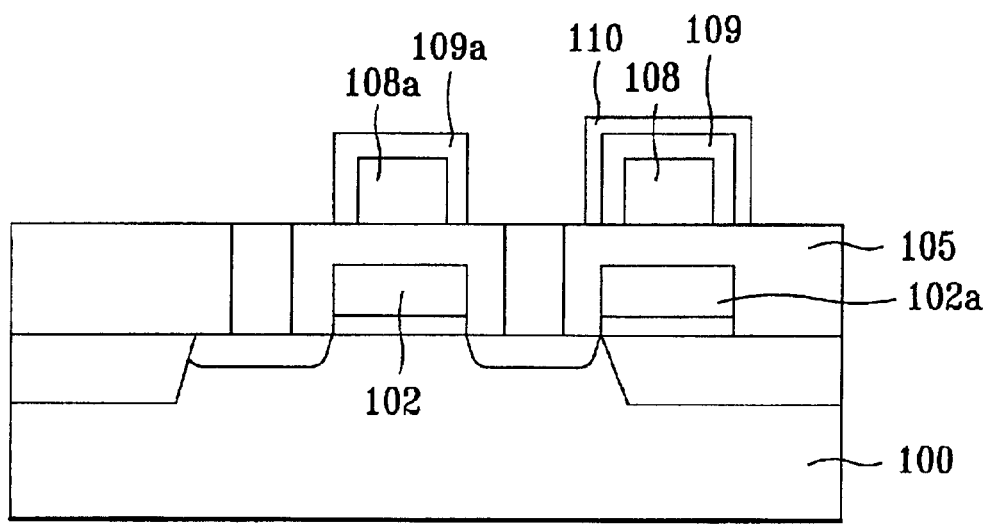

As shown in FIG. 11f, the second electrode material layer of the ferroelectric capacitor is formed on the entire surface including the first and second ferroelectric layers 109 and 109a and then patterned to form the second electrode 110 of the first ferroelectric capacitor and the second electrode 110a (not shown) of the second ferroelectric capacitor. The second electrode 110 of the first ferroelectric capacitor is formed on the surface of the first ferroelectric layer 109, and the second electrode 110a (not shown) of the second ferroelectric capacitor is formed on the surface of the second ferroelectric layer 109a.

At this time, the second electrode 110 of the first ferroelectric capacitor is preferably patterned to remain only on the first ferroelectric layer 109 at one side of the second active region 100b. The second electrode 110a of the second ferroelectric capacitor is preferably patterned to remain only on the second ferroelectric layer 109a at one side of the first active region 100a. In other words, the second electrode material of the ferroelectric capacitor formed on the active region is removed so that the second electrodes remain only on the field region. Since FIG. 11f is a sectional view, such as taken along line I–I' of FIG. 10f, the second electrode 110a of the second ferroelectric capacitor is not shown.

Figure 11G:
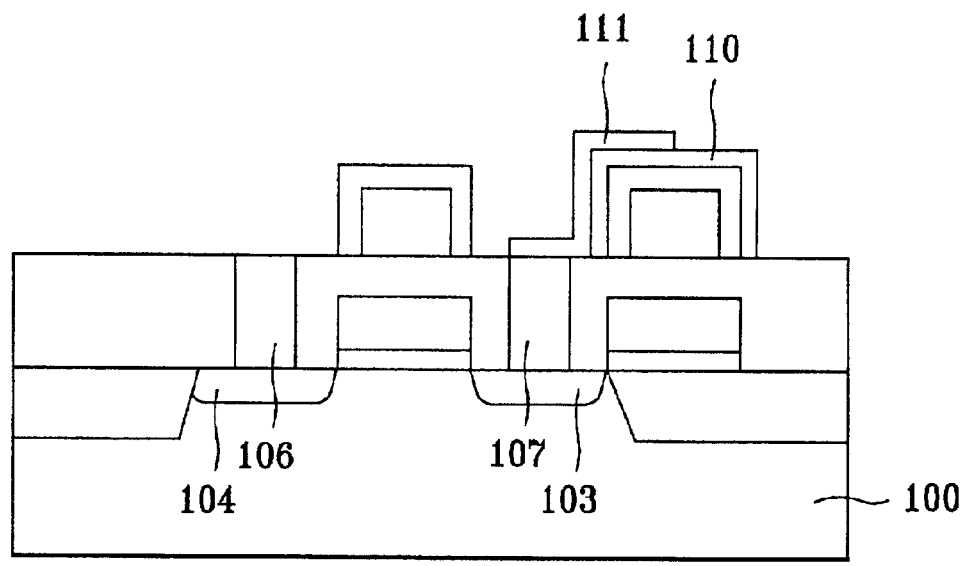

As shown in FIG. 11g, the first conductive layer 111 and the second conductive layer 111a (not shown) are formed. The first conductive layer 111 electrically couples the second plug 107 coupled to the first source region 103 with the second electrode 110 of the first ferroelectric capacitor. The second conductive layer 111a electrically couples the second plug 107 coupled to the second source region 103a with the second electrode 110a of the second ferroelectric capacitor. In FIG. 11g, only the first conductive layer 111 is shown.

Alternatively, when the second electrodes of the first and second ferroelectric capacitors are formed without forming the first and second conductive layers 111 and 111a, the second electrode 110 of the first ferroelectric capacitor may be formed with a sufficient width to be coupled with the second plug 107 coupled to the first source region 103. The second electrode 110a of the second ferroelectric capacitor is then formed with a sufficient width to be coupled with the second plug 107 coupled to the second source region 103a.

Figure 11H:
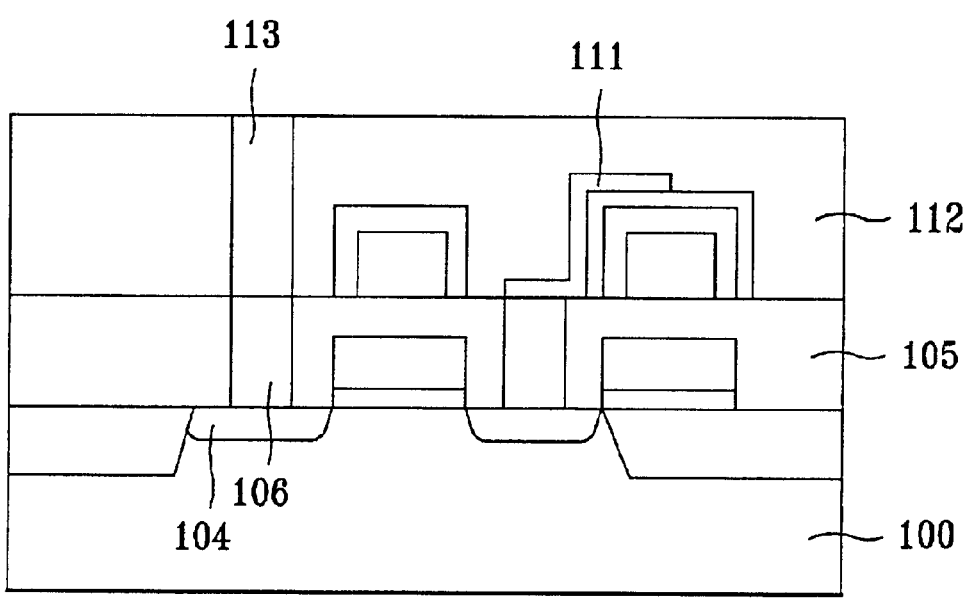

As shown in FIG. 11h, the second insulating layer 112 is formed on the entire surface including the first and second conductive layers 111 and 111a. The upper surface of the second insulating layer 112 is planarized preferably by the CMP process.

The second insulating layer 112 is selectively removed to form contact holes that expose the first plug 106 coupled to the first drain region 104 and the first plug 106 coupled to the second drain region 104a. A conductive material is buried in the contact hole to form the third plugs 113 respectively coupled with the first plugs 106. In FIG. 11h, the third plug 113 coupled to the first plug 106 coupled with the second drain region 104a is not shown.

Figure 11I:
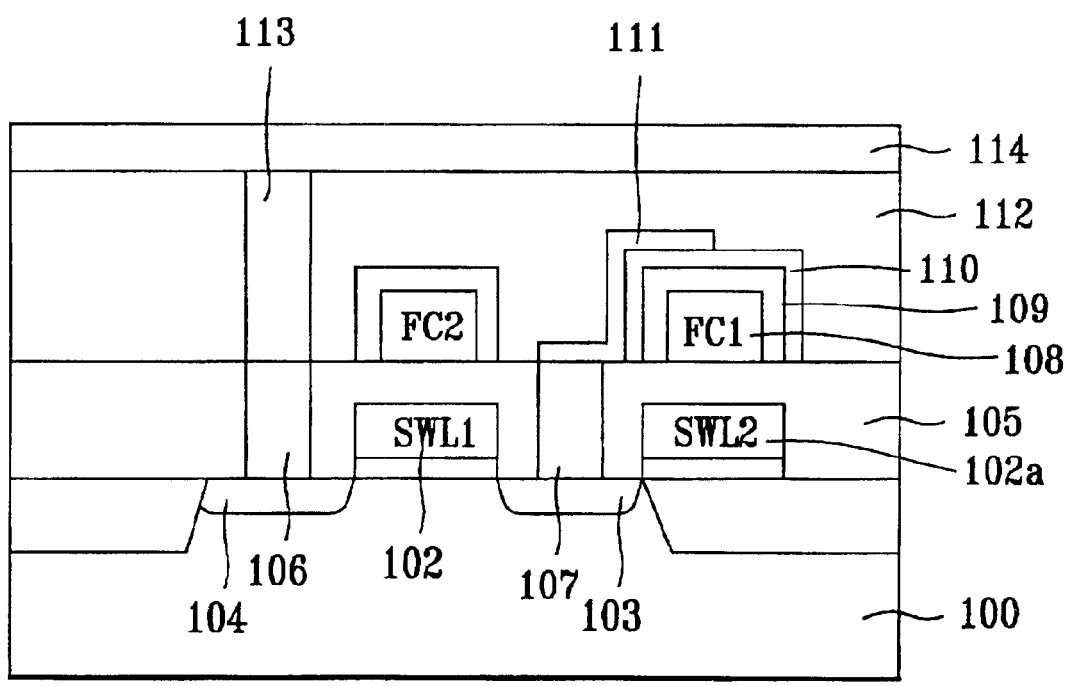

As shown in FIG. 11i, a bitline material layer is preferably formed on the entire surface including the third plugs 113 and then patterned to form the first bitline 114 and the second bitline 114a (not shown). The first bitline 114 and the second bitline 114a are respectively coupled with the third plugs 113.

Thus, the first bitline 114 is coupled with the first plug 106 coupled to the first drain region 104, and the second bitline 114a is coupled with the first plug 106 coupled to the second drain region 104a. The first and second bitlines 114 and 114a are formed across the first and second split wordlines 102 and 102a.

Figure 12:
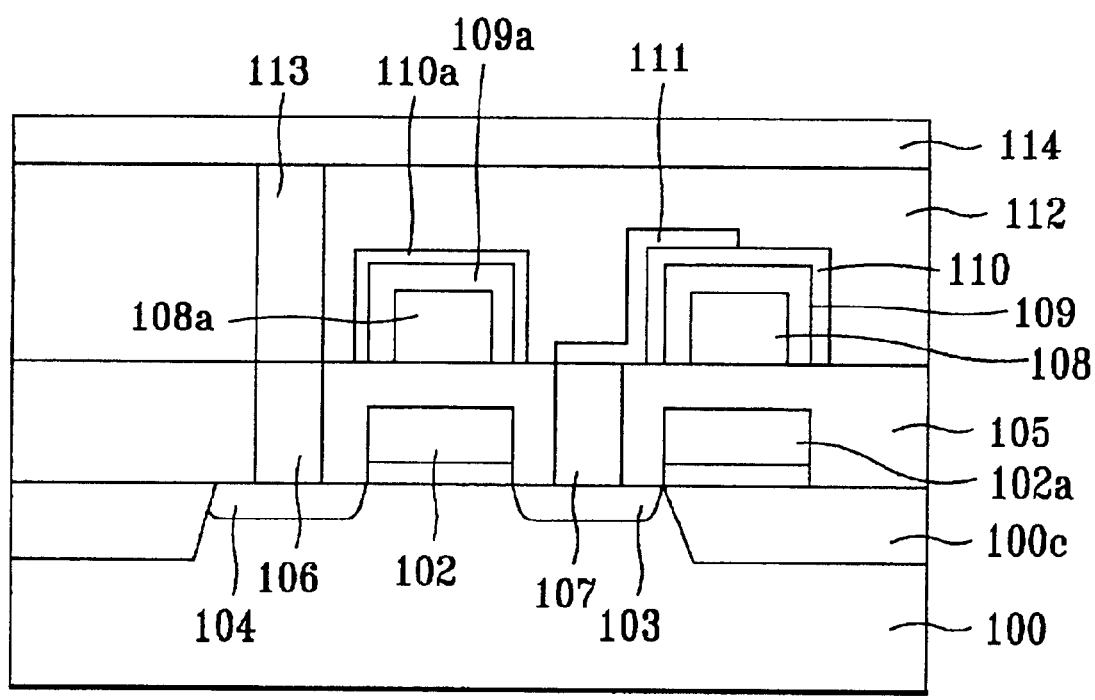
FIG. 12 is a diagram that shows a cross-sectional view illustrating a memory device according to another preferred embodiment of the present invention.

FIG. 12 is a diagram that shows a sectional view of a nonvolatile ferroelectric memory device according to a second embodiment of the present invention. The second preferred embodiment according to the present invention differs from the first preferred embodiment in at least the second electrodes of the ferroelectric capacitors. In the first preferred embodiment, the second electrodes of the first and second ferroelectric capacitors remain only on the field region by etching the second electrode material of the ferroelectric capacitor on the active regions. Accordingly, the second electrode of the first ferroelectric capacitor and the second electrode of the second ferroelectric capacitor in the first preferred embodiment are preferably asymmetrically formed.

In the second preferred embodiment, the second electrode of the first ferroelectric capacitor and the second electrode of the second ferroelectric capacitor are preferably formed within a square shape being rectangles parallel to each other. Preferably, the first active region and the second active region are formed in parallel to each other in a column direction, and the second electrodes of the first and second ferroelectric capacitors are formed from the first active region to the second active region in a row direction.

A nonvolatile ferroelectric memory device according to the second preferred embodiment according to the present invention will now be described. As shown in FIG. 12, the nonvolatile ferroelectric memory device includes a semiconductor substrate 100 in which an active region and a field region 100c are defined. A first split wordline 102 is formed on the semiconductor substrate of the active region. A second split wordline 102a is formed on the semiconductor substrate of the field region 100c. First source and drain regions 103 and 104 are formed in the active region at both sides of the first split wordline 102. Second source and drain regions 103a and 104a (not shown) are formed in the active region at both sides of the second split wordline 102a.

A first plug 106 is coupled to the first drain region 104 through a first insulating layer 105. A second drain region 104a and a first plug 106 coupled to the second drain region 104a are not shown. A second plug 107 is coupled to the first source region 103 through the first insulating layer 105. A second source region 103a and a second plug 107 coupled to the second source region 103a are not shown. A first electrode 108a of a second ferroelectric capacitor is formed on the first insulating layer 105 on the first split wordline 102, and a first electrode 108 of a first ferroelectric capacitor is formed on the first insulating layer 105 on the second split wordline 102a. A first ferroelectric layer 109 is formed on the first electrode 108 of the first ferroelectric capacitor. A second ferroelectric layer 109a is formed on the first electrode 108a of the second ferroelectric capacitor. A second electrode 110 of the first ferroelectric capacitor is formed on the first ferroelectric layer 109, and a second electrode 111a of the second ferroelectric capacitor is formed on the second ferroelectric layer 109a. A first conductive layer 111 electrically couples the second plug 107 coupled to the first source region 103 with the second electrode 110 of the first ferroelectric capacitor. A second conductive layer 111a (not shown) electrically couples the second plug 107 coupled to the second source region 103a with the second electrode 110a.

A second insulating layer 112 is formed on an entire surface including the first and second conductive layers 111 and 111a. A third plug 113 is electrically coupled with the first plug 106 coupled to the first drain region 104. A third plug 113 coupled with the first plug 106 coupled to the second drain region 104a is not shown. A first bitline 114 and a second bitline 114a (not shown) are respectively coupled with the third plugs 113.

Figure 13A:
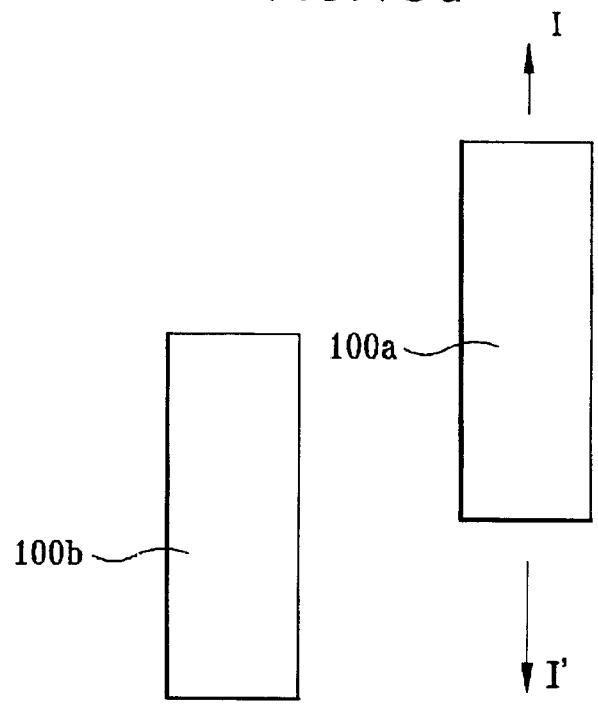
FIGS. 13a to 13i are diagrams that illustrate layouts of a memory device according to the preferred embodiment of FIG. 12.

The second preferred embodiment of the nonvolatile ferroelectric memory device will now be described using FIGS. 13a to 13i that are diagrams showing layouts of the nonvolatile ferroelectric memory device according to the second preferred embodiment. As shown in FIG. 13a, active regions 100a and 100b are defined on a first conductive type semiconductor substrate. The active regions 100a and 100b are spaced apart from each other and asymmetrically parallel to each other. A field region (e.g., device isolation layer) is formed on the semiconductor substrate other than the active regions 100a and 100b preferably by a trench isolation process.

Figure 13B:
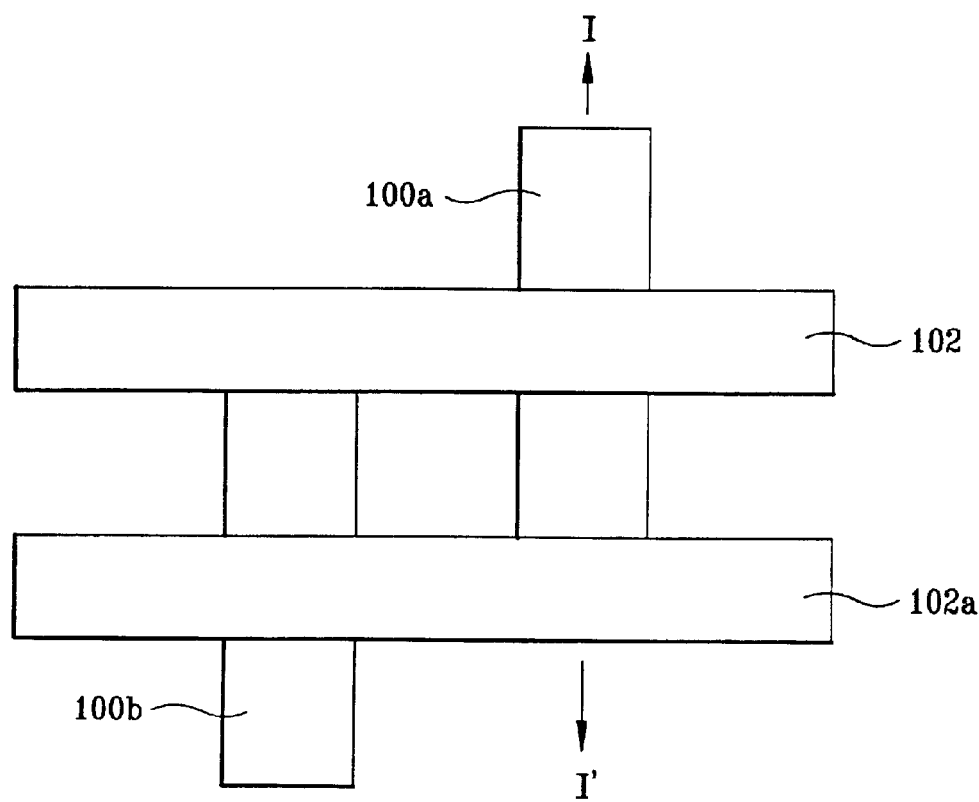

As shown in FIG. 13b, first and second split wordlines (SWL1) 102 and (SWL2) 102a are formed across the active regions to divide each of the active regions 100a and 100b into two. The first split wordline 102 becomes a gate electrode of the first transistor T1 while the second split wordline 102a becomes a gate electrode of the second transistor T2. Subsequently, impurity ions of a conductivity type opposite to the substrate are implanted into the first active region at both sides of the first split wordline 102 to form first source and drain regions. Second source and drain regions are preferably formed in the second active region at both sides of the second split wordline 102a at the same time.

Figure 13C:
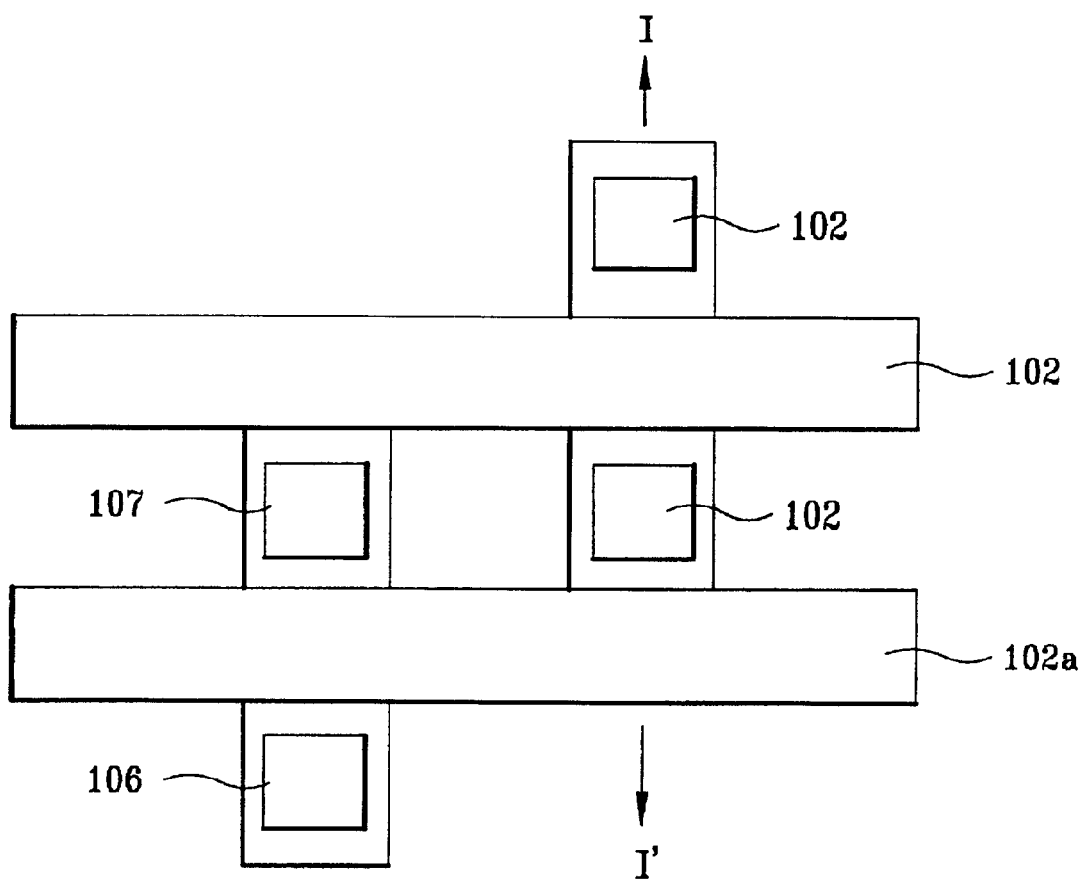

As shown in FIG. 13c preferably after the first insulating layer 105 (not shown), the first plugs 106 are formed to be respectively coupled to the first and second drain regions. Also, the second plugs 107 are formed to be respectively coupled with the first and second source regions.

Figure 13D:
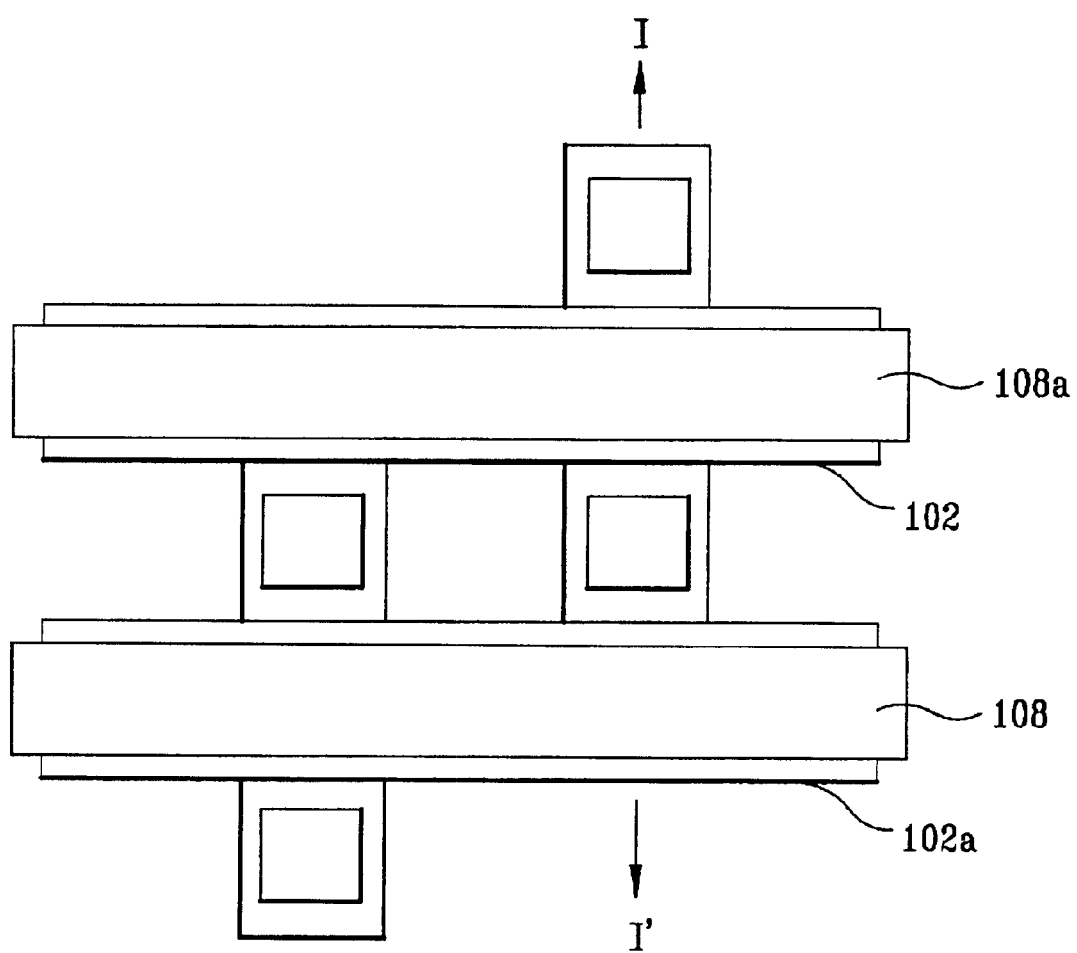

As shown in FIG. 13d, the first electrode 108a of the second ferroelectric capacitor (e.g., FC2) is formed over the first split wordline 102 while the first electrode 108 of the first ferroelectric capacitor (e.g., FC1) is formed over the second split wordline 102a. At this time, the first electrodes 108 and 108a of the first and second ferroelectric capacitors preferably have widths smaller than or equal to the first and second split wordlines 102 and 102a.

The first electrode 108 of the first ferroelectric capacitor is electrically coupled to the second split wordline 102a while the first electrode 108a of the second ferroelectric capacitor is electrically coupled to the first split wordline 102.

Figure 13E:
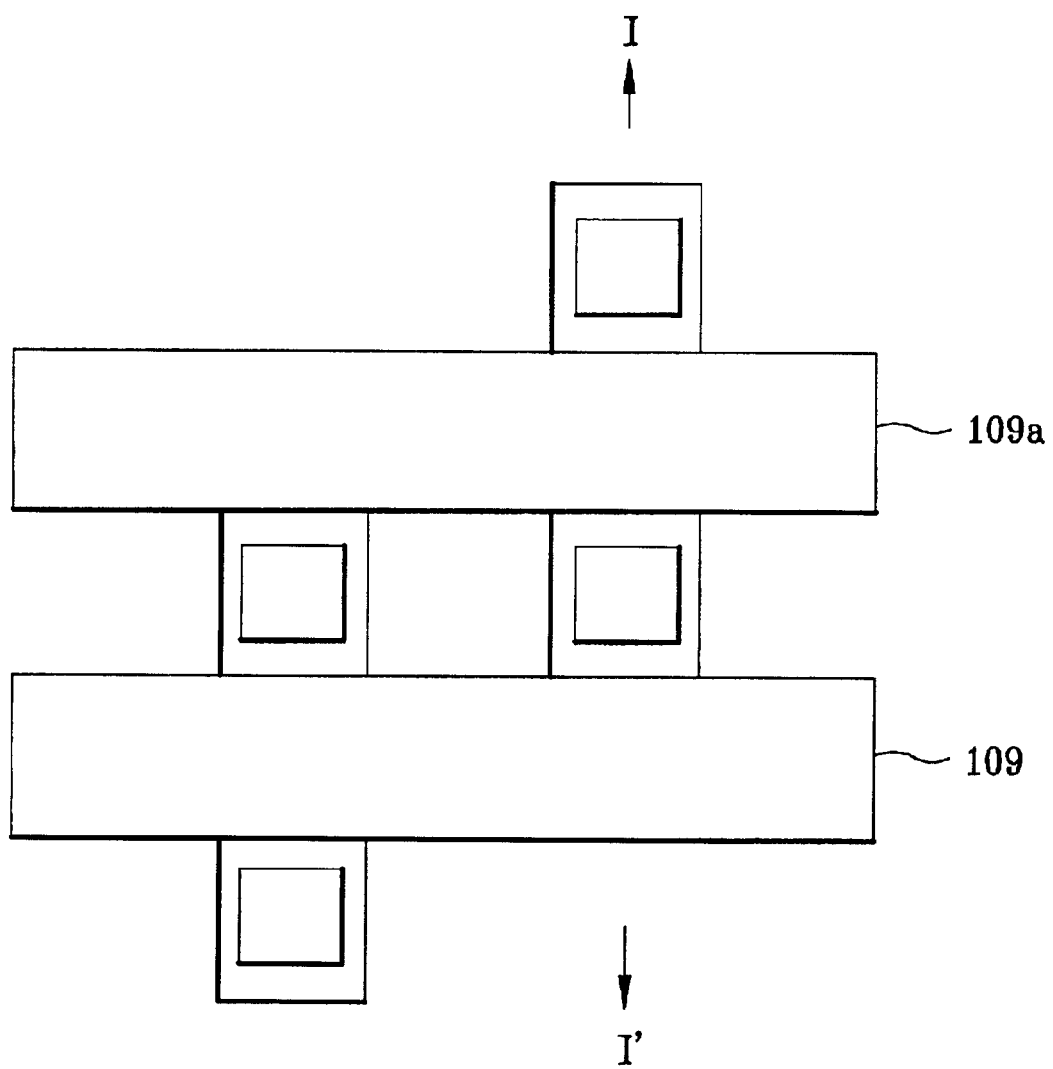

As shown in FIG. 13e, the first ferroelectric layer 109 is formed on the first electrode 108 of the first ferroelectric capacitor while the second ferroelectric layer 109a is formed on the first electrode 108a of the second ferroelectric capacitor. That is to say, a ferroelectric material is preferably deposited on the entire surface including the first electrodes 108 and 108a of the first and second ferroelectric capacitors and then patterned to remain on the first electrode of the first ferroelectric capacitor and the first electrode of the second ferroelectric capacitor.

Figure 13F:
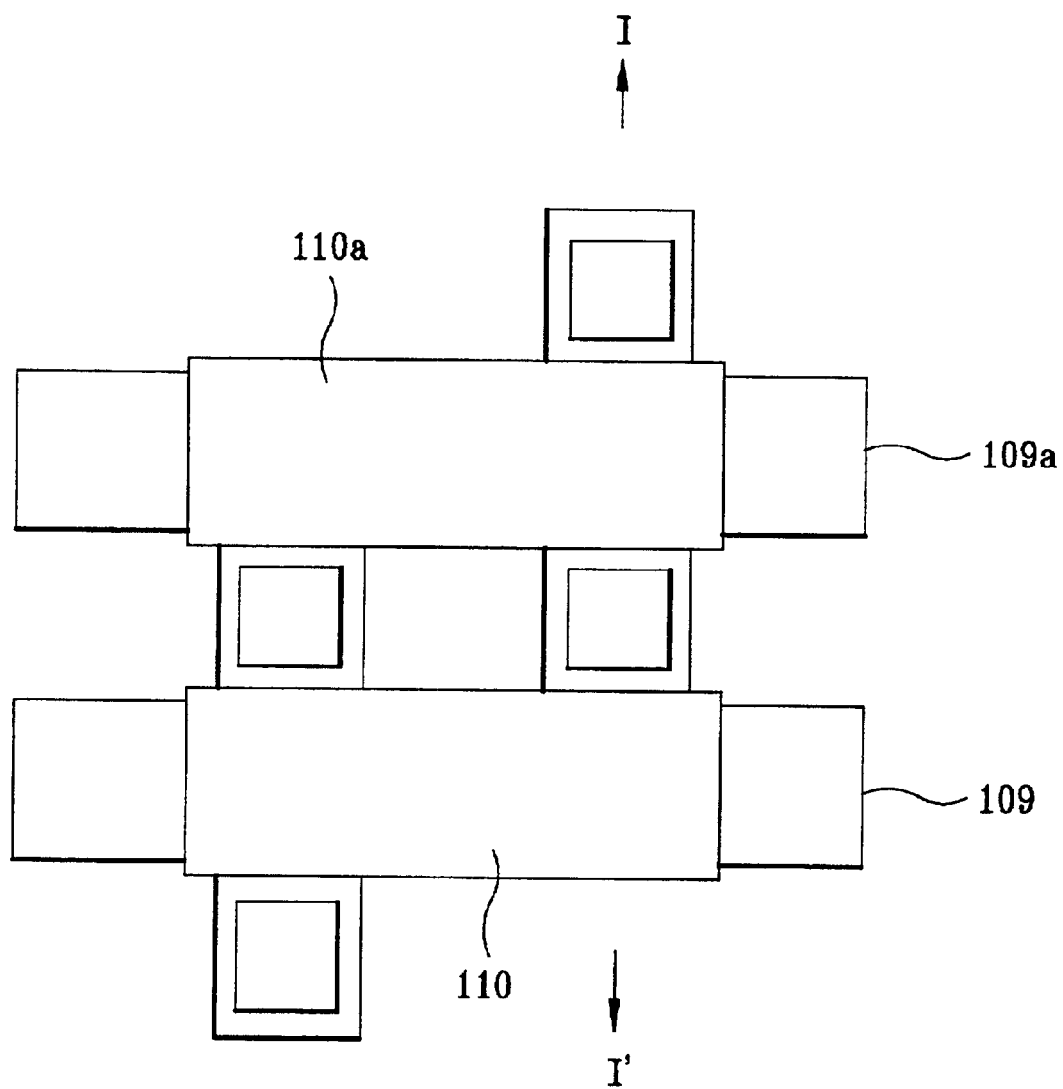

As shown in FIG. 13f, a second electrode material of the ferroelectric capacitors is deposited on the entire surface including the first and second ferroelectric layers 109 and 109a. The second electrode material is then preferably patterned to form the second electrode 110 of the first ferroelectric capacitor and the second electrode 110a of the second ferroelectric capacitor. The second electrode 110 of the first ferroelectric capacitor is preferably formed from a region between the source and drain regions of the second active region 100b to the field region below the first active region 100a. The second electrode 110a of the second ferroelectric capacitor is preferably formed from the field region on the second active region 100b to a region between the source and drain regions of the first active region 100a. The second electrode 110 of the first ferroelectric capacitor and the second electrode 110a of the second ferroelectric capacitor are preferably asymmetrically formed relative to the active regions along the first and second split wordlines 102 and 102a and are parallel to each other.

Figure 13G:
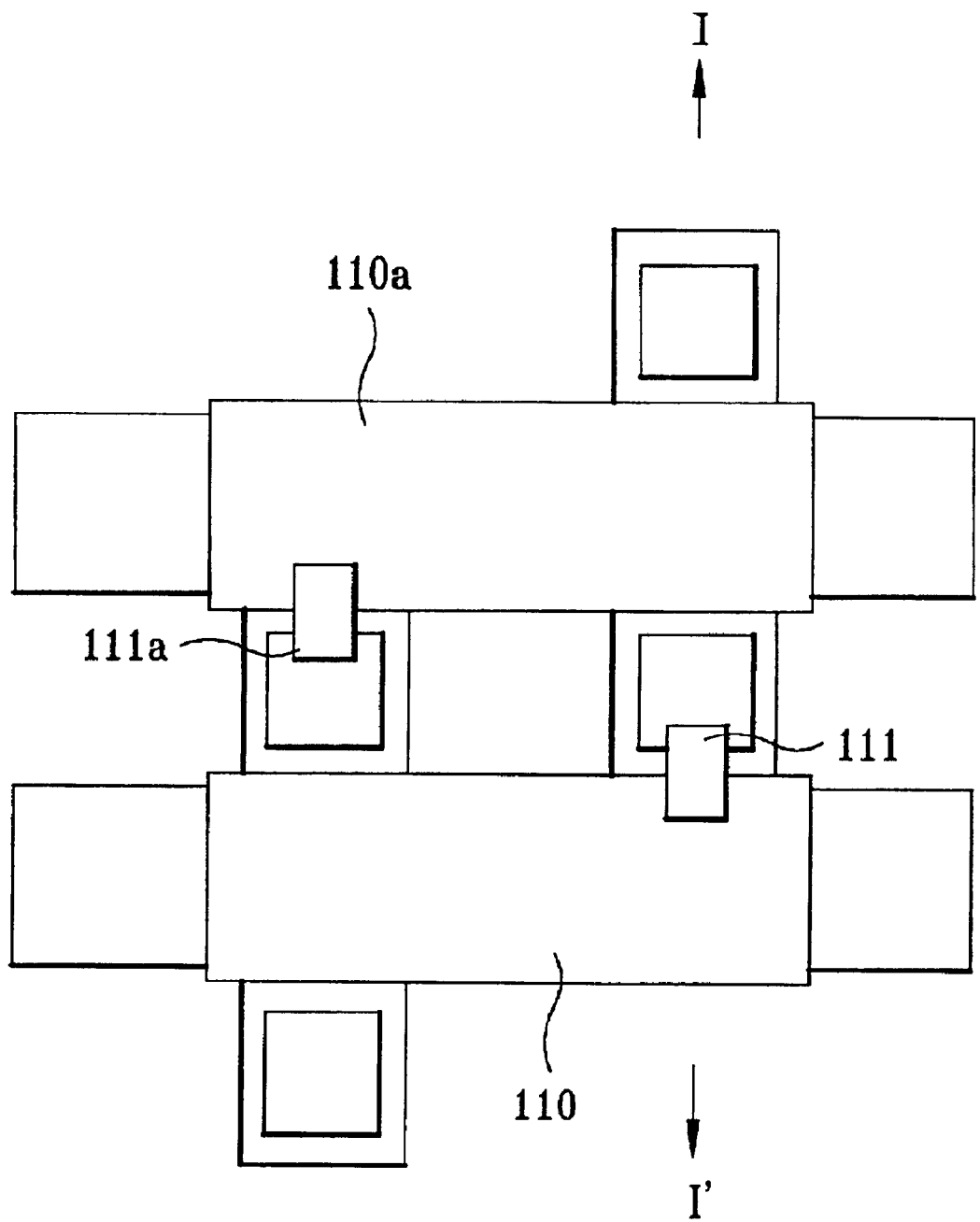

As shown in FIG. 13g, the first conductive layer 111 and the second conductive layer 111a are formed. The first conductive layer 111 electrically couples the second plug 107 coupled to the first source region 103 with the second electrode 110 of the first ferroelectric capacitor. The second conductive layer 111a electrically couples the second plug 107 coupled to the second source region 103a with the second electrode 110a of the second ferroelectric capacitor.

When the first and second conductive layers 111 and 111a are formed, the second electrodes are directly coupled to the second plugs, not through a contact hole. Thus, the process can be simplified.

Figure 13H:
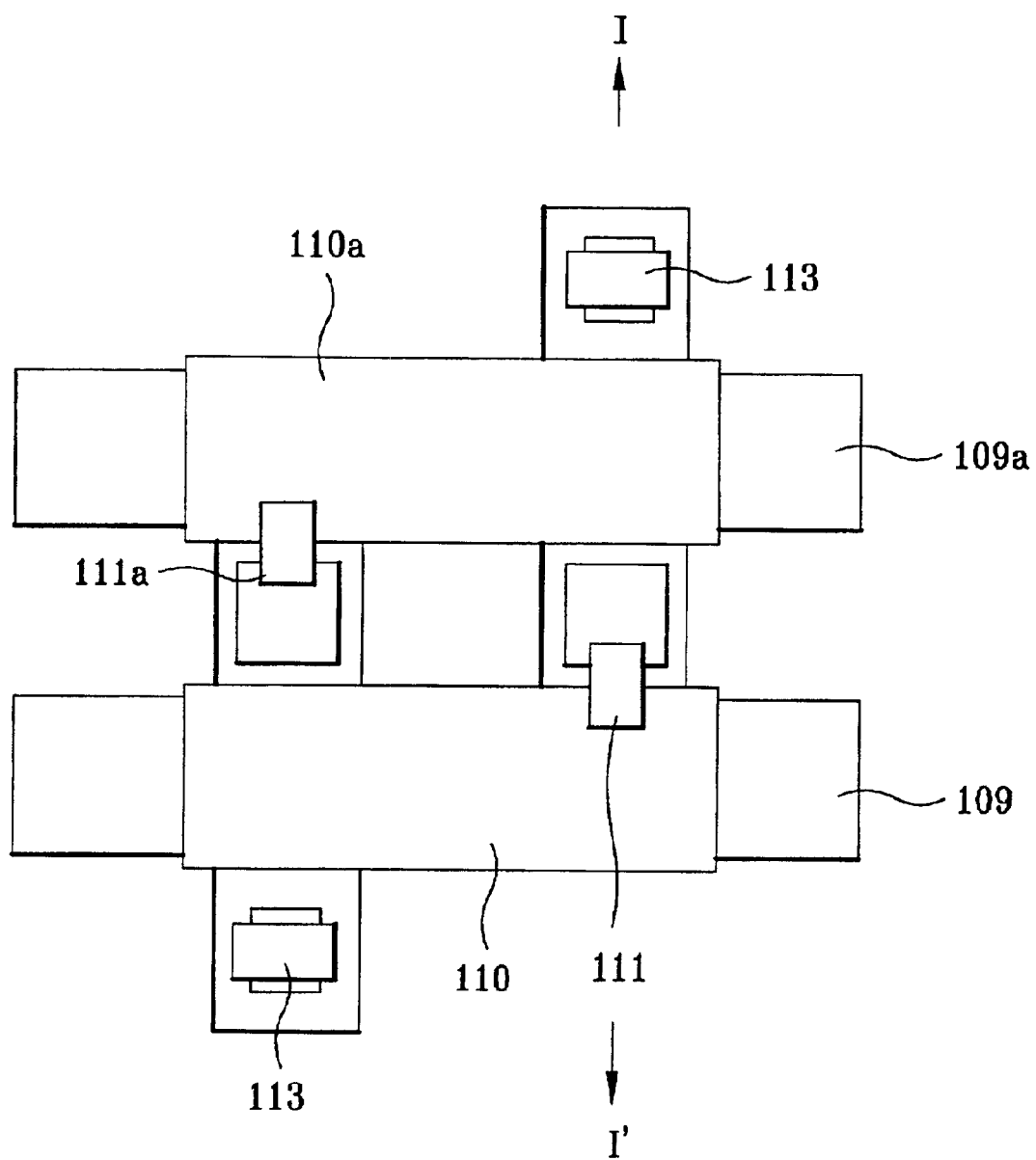

Subsequently, as shown in FIG. 13h, the second insulating layer (not shown) is preferably formed on the entire surface including the first and second conductive layers 111 and 111a and then planarized by CMP process. The third plugs 113 are then formed to be respectively coupled with the first plugs 106 respectively coupled to the first and second drain regions 104 and 104a.

Figure 13I:
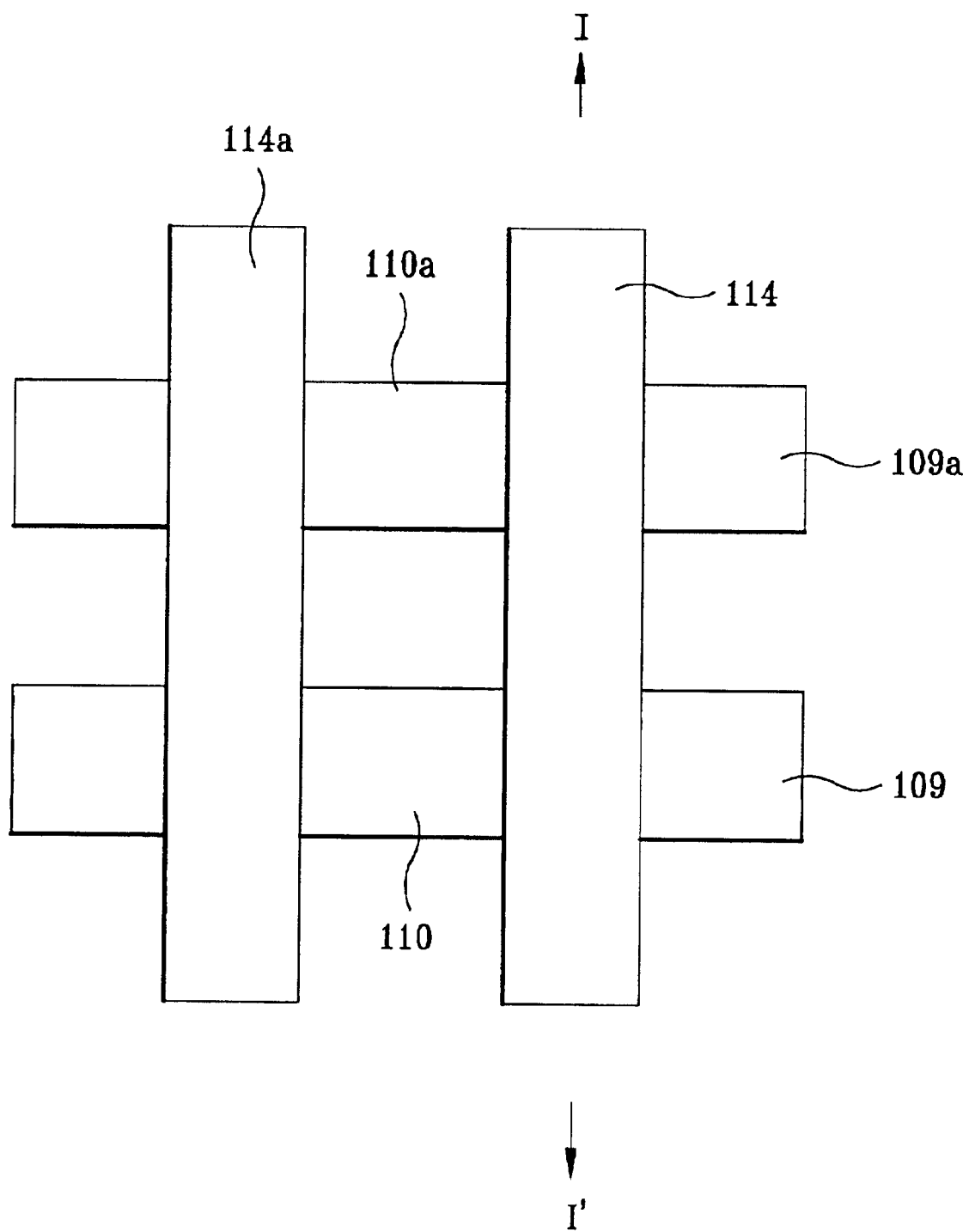

As shown in FIG. 13i, the first bitline 114 and the second bitline 114a are formed across and preferably perpendicular to the first and second split wordlines 102 and 102a. The first bitline 114 is electrically coupled with the third plug 113 coupled to the first drain region 104. The second bitline 114a is electrically coupled with the third plug 113 coupled to the second drain region 104a. Thus, the layout process of the second preferred embodiment of the nonvolatile ferroelectric memory device according to the present invention is completed.

A second preferred embodiment of a method for fabricating the nonvolatile ferroelectric memory device according to the present invention will now be described with reference to FIGS. 14a to 14i. The second preferred embodiment of a process for fabricating a nonvolatile ferroelectric memory device can be used, for example, to fabricate the second preferred embodiment of the nonvolatile ferroelectric memory device.

Figure 14A:
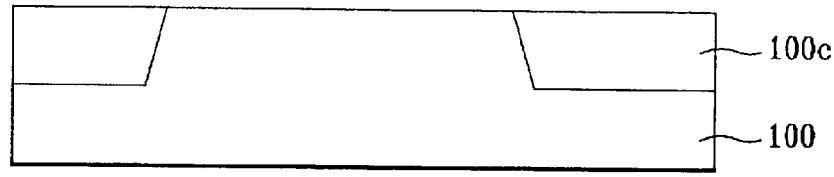
FIGS. 14a to 14i are diagrams that illustrate sections taken along line I–I' in FIG. 12 of another preferred embodiment of a method for fabricating a memory device in accordance with the present invention.

As shown in FIG. 14a, the semiconductor substrate 100 is defined as the active regions 100a and 100b and the field region 100c. The field region is preferably formed by a trench isolation process.

Figure 14B:
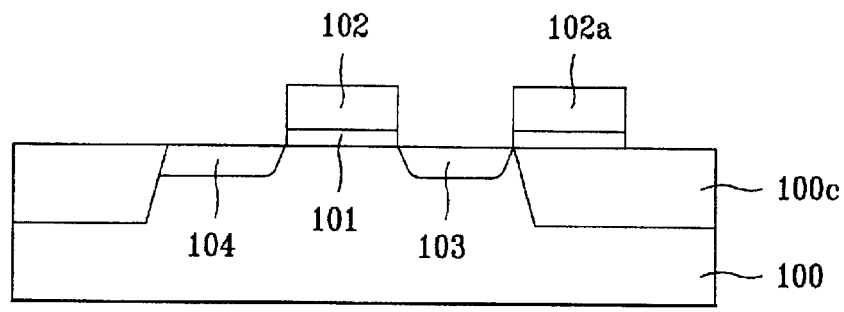

As shown in FIG. 14b, the first split wordline 102 and the second split wordline 102a are formed on a gate insulating layer 101 formed on the active regions and the field region. The first split wordline 102 is preferably used as the gate electrode of the first transistor T1 while the second split wordline 102a is preferably used as the gate electrode of the second transistor T2. Thereafter, the impurity ions are implanted into the substrate using the first and second split wordlines 102 and 102a as masks. Thus, the first source and drain regions 103 and 104 and the second source and drain regions 103a and 104a (not shown) are formed. The first source and drain regions 103 and 104 will be used as source and drain of the first transistor T1, and the second source and drain regions 103a and 104a will be used as source and drain of the second transistor T2.

Figure 14C:
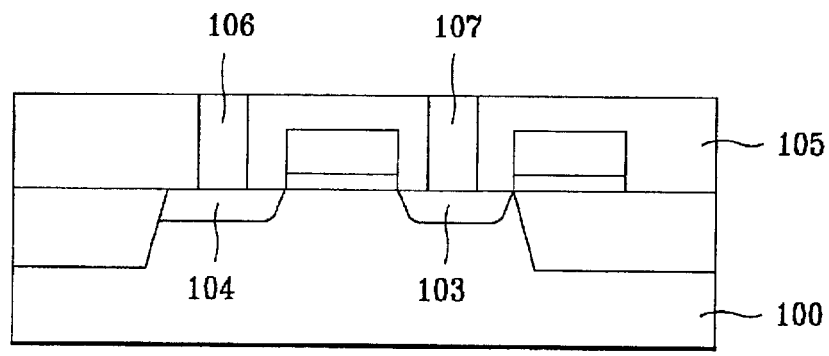

As shown in FIG. 14c, the first insulating layer 105 is formed on the entire surface of the substrate including the first and second split wordlines 102 and 102a. The first insulating layer 105 is preferably planarized by CMP process. The first insulating layer 105 is then patterned to form contact holes that expose the first and second source regions 103 and 103a and the first and second drain regions 104 and 104a. A polysilicon or a metal such as tungsten is preferably buried in the contact hole to form the first plugs 106 and the second plugs 107. The first plugs 106 are formed to be coupled to the first and second drain regions 104 and 104a (not shown). The second plugs 107 are formed to be coupled to the first and second source regions 103 and 103a (not shown).

Figure 14D:
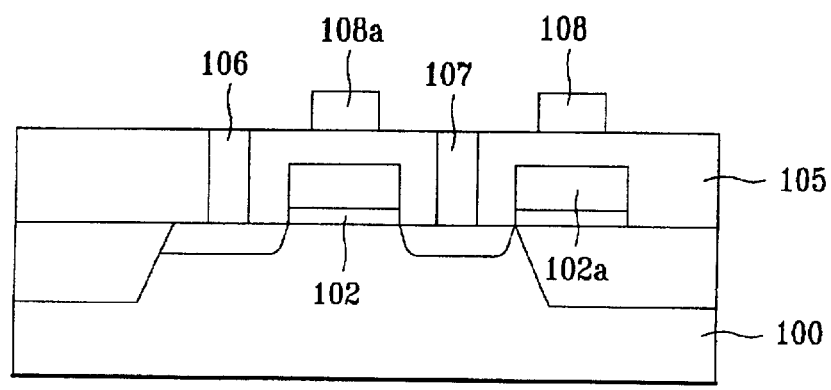

As shown in FIG. 14d, the first electrode material of the ferroelectric capacitor is formed on the entire surface including the first and second plugs and then patterned to remain over the first and second split wordlines 102 and 102a. Thus, the first electrode 108a of the second ferroelectric capacitor is formed over the first split wordline 102, and the first electrode 108 of the first ferroelectric capacitor is formed over the second split wordline 102a.

The first split wordline 102 and the first electrode 108a of the second ferroelectric capacitor are electrically coupled to each other. The second split wordline 102a and the first electrode 108 of the first ferroelectric capacitor are electrically coupled to each other. However, before forming the first electrodes, a barrier layer may be formed.

Figure 14E:
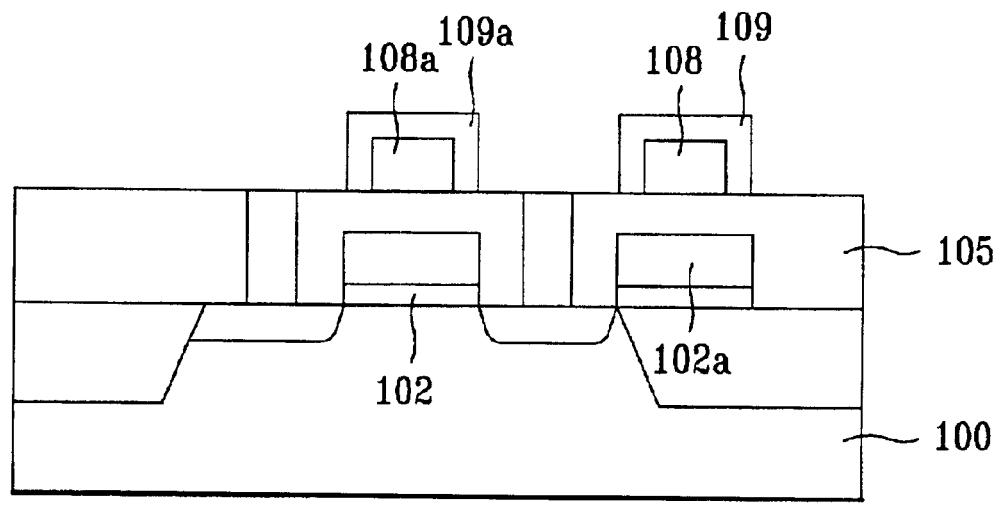

Subsequently, as shown in FIG. 14e, the first ferroelectric layer 109 is formed on the surface of the first electrode 108 of the first ferroelectric capacitor, and the second ferroelectric layer 109a is formed on the surface of the first electrode 108a of the second ferroelectric capacitor. Preferably, the ferroelectric layers are formed to surround the upper surfaces and both sides of the first electrodes.

Figure 14F:
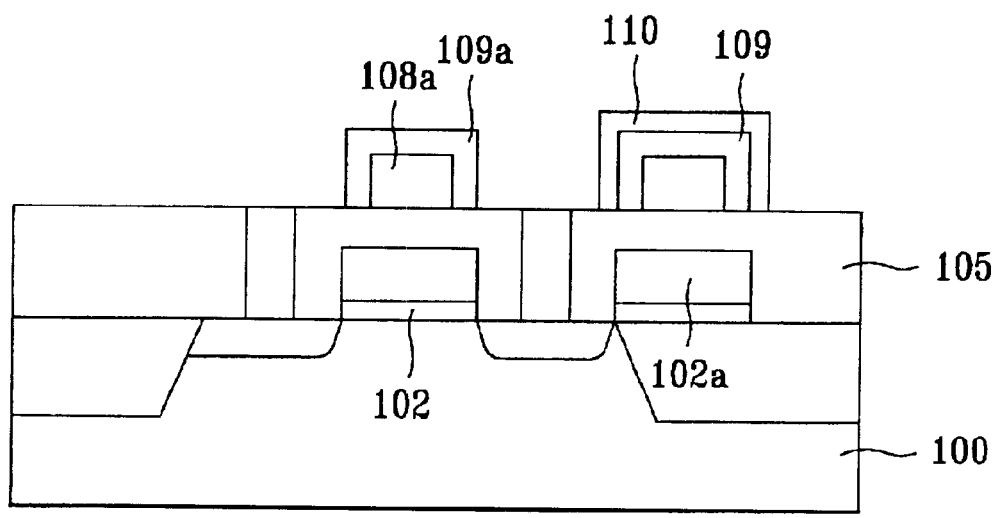

As shown in FIG. 14f, the second electrode material layer of the ferroelectric capacitor is formed on the entire surface including the first and second ferroelectric layers 109 and 109a and then patterned to form the second electrode 110 of the first ferroelectric capacitor and the second electrode 110a of the second ferroelectric capacitor. The second electrode 110 of the first ferroelectric capacitor is formed on the surface of the first ferroelectric layer 109, and the second electrode 110a of the second ferroelectric capacitor is formed on the surface of the second ferroelectric layer 109a.

At this time, the second electrode 110 of the first ferroelectric capacitor is preferably formed from a region between the source and drain regions of the second active region 100b to the field region below the first active region 100a, and the second electrode 110a of the second ferroelectric capacitor is preferably formed from a region between the source and drain regions of the first active region 100a to the field region above the second active region 100b. Accordingly, the second electrode 110 of the first ferroelectric capacitor and the second electrode 110a of the second ferroelectric capacitor are symmetrically formed in parallel and spaced apart from each other.

Figure 14G:
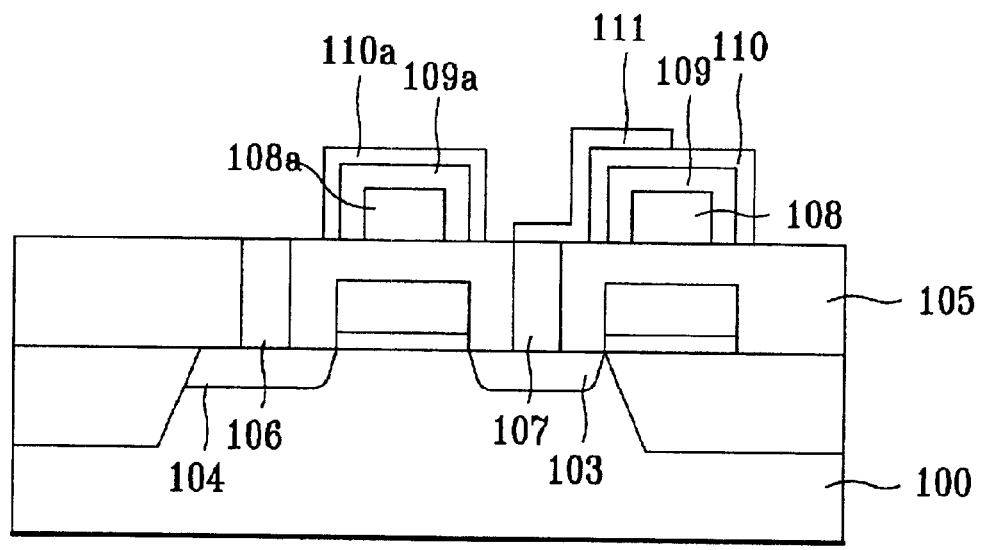

As shown in FIG. 14g, the first conductive layer 111 and the second conductive layer 111a (not shown) are formed. The first conductive layer 111 electrically couples the second plug 107 coupled to the first source region 103 with the second electrode 110 of the first ferroelectric capacitor. The second conductive layer 111a electrically couples the second plug (not shown) coupled to the second source region (not shown) with the second electrode 110a of the second ferroelectric capacitor. Since FIG. 14g is a sectional view, such as along line I–I' of FIG. 13g, the second conductive layer is not shown.

Figure 14H:
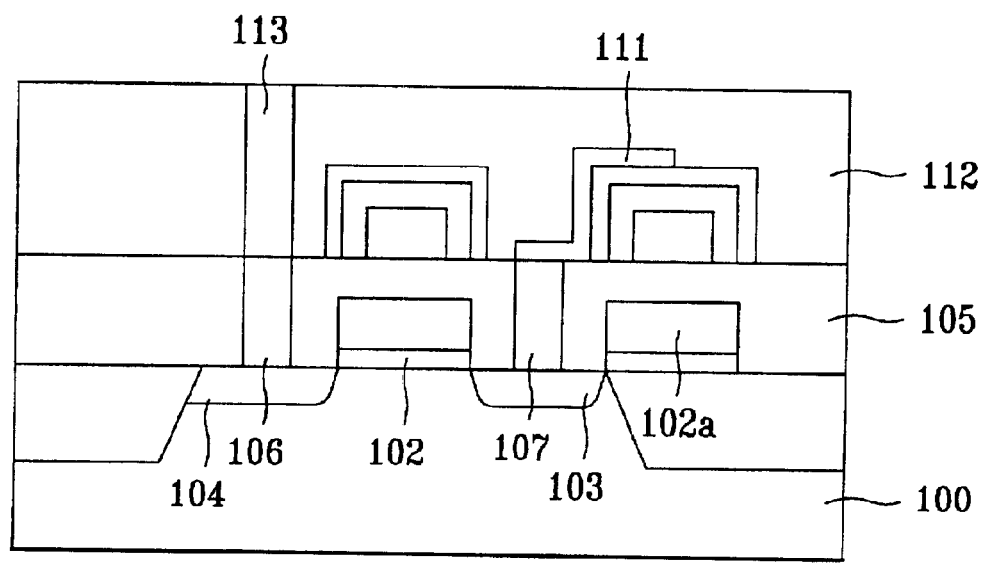
Figure 14I:
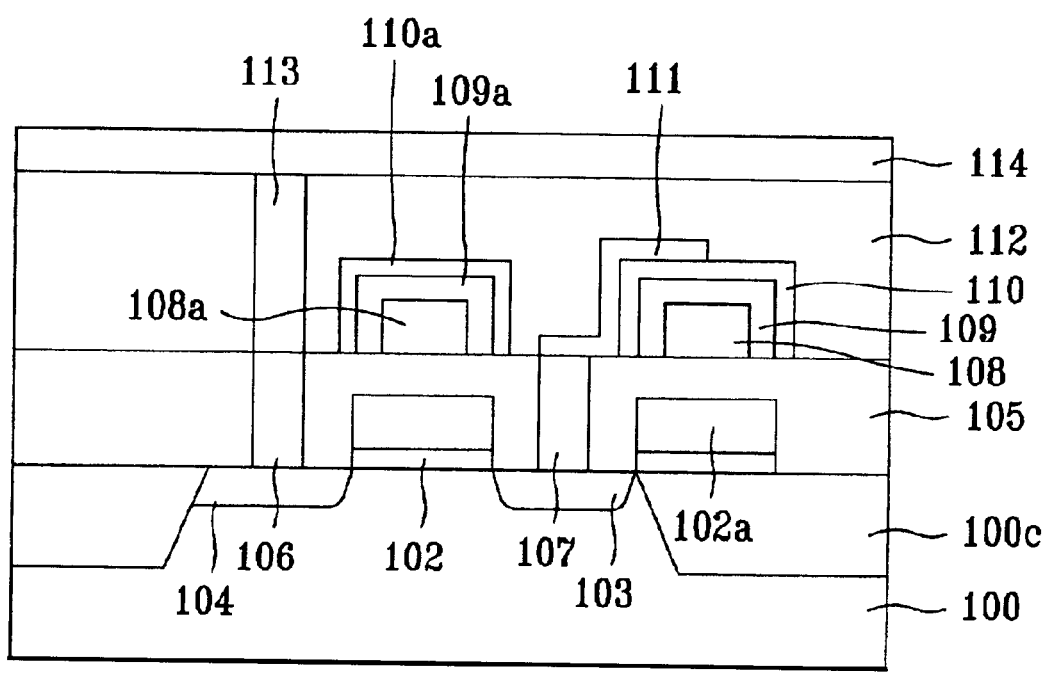

As shown in FIG. 14h, the second insulating layer 112 is formed on the entire surface including the first and second conductive layers 111 and 111a. The upper surface of the second insulating layer 112 is planarized preferably by the CMP process.

The second insulating layer 112 is selectively removed to form contact holes that expose the first plug 106 coupled to the first drain region 104 and the first plug 106 (not shown) coupled to the second drain region 104a (not shown). A conductive material is buried in the contact hole to form the third plugs 113 respectively coupled to the first plugs 106. In FIG. 14h, the first plug coupled to the second drain region 104a and the third plug 113 coupled to the first plug 106 are not shown.

As shown in FIG. 11i, a bitline material layer is preferably formed on the entire surface including the third plugs 113 and then patterned to form the first bitline 114 and the second bitline 114a (not shown). The first bitline 114 and the second bitline 114a are respectively coupled to the third plugs 113.

At this time, the first bitline 114 is preferably coupled with the third plug 113 coupled to the first drain region 104 through the first plug 106, and the second bitline 114a is coupled with the third plug 113 coupled to the second drain region 104a through the first plug 106. The first and second bitlines 114 and 114a are formed across and preferably perpendicular to the first and second split wordlines 102 and 102a.

In the second preferred embodiment of the ferroelectric memory device and the method for fabricating the ferroelectric memory device according to the present invention, the second electrode of the first ferroelectric capacitor and the second electrode of the second ferroelectric capacitor are symmetrically formed with respect to each other in parallel along the second split wordline and the first split wordline, respectively.

As described above, preferred embodiments of the nonvolatile ferroelectric memory device and methods for fabricating the same have various advantages. A process margin can be ensured to electrically couple the second electrodes of the ferroelectric capacitors with the substrate according to the preferred embodiments. Therefore, the process steps can be facilitated. For example, in one preferred embodiment, since second electrodes of the capacitors are asymmetrically formed in parallel, process margins for forming a first conductive layer and a second conductive layer, which connect the second electrodes with second plugs coupled to the substrate, can be ensured. Further, since the first and second conductive layers that couple the second electrodes of the ferroelectric capacitors with the second plugs coupled to the substrate are formed to be directly coupled with the second electrodes and not through a contact hole or the like, a process can be simplified and the number of masks can be reduced. Thus, a fabrication time and expense can be reduced, which reduces a device cost. In addition, it is possible to efficiently reduce a layout area of the cell.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A method for fabricating a nonvolatile ferroelectric memory device, the method comprising:

defining a first active region and a second active region on a semiconductor substrate;

forming a first split wordline across the first active region and a second split wordline across the second active region;

forming first and second source and drain regions in the first and second active regions, respectively, wherein the source and drain regions are at opposite sides of the first and second split wordlines;

forming an insulating layer on an entire surface including first and second split word lines and the first and second active regions;

forming contact holes by selectively removing the insulating layer, wherein the contact holes includes first contact holes exposing the first and second drain regions and second contact holes exposing the first and second source regions;

forming first plugs coupled to the first and second drain regions through the first contact holes;

forming second plugs coupled to the first and second source regions through the second contact holes;

respectively forming first electrodes of first and second ferroelectric capacitors over the second and first split wordlines;

forming ferroelectric layers on the first electrodes;

respectively forming second electrodes of the first and second ferroelectric capacitors on surfaces of the ferroelectric layers;

forming a conductive material layer on an entire surface including the second electrodes of the first and second ferroelectric capacitors;

respectively forming conductive layers by selectively removing the conductive material layer, wherein that the conductive layers couple the second plugs with the second electrodes of the first and second ferroelectric capacitors; and forming first and second bitlines across the first and second split wordlines, wherein the first and second bitlines are coupled to the first and second drain regions through the first plugs.

2. The method of claim 1, wherein the first active region and the second active region are spaced apart from each other and asymmetrically formed each extending in a first direction.

3. The method of claim 1, wherein the first electrode of the first and second ferroelectric capacitors are formed on the insulating layer, wherein the first electrode of the first ferroelectric capacitor is formed over second the split wordline and the first electrode of the second ferroelectric capacitor is formed over the first split wordline.

4. The method of claim 1, wherein forming the second electrodes of the first and second ferroelectric capacitors comprises:

forming an electrode material layer of the first and second ferroelectric capacitors on an entire surface including the first and second ferroelectric layers; and selectively removing the electrode material layer, wherein the second electrode of the first ferroelectric capacitor and the second electrode of the second ferroelectric capacitor are respectively formed on the field regions at both sides of the active region.

5. The method of claim 4, further comprising forming third plugs coupled to the first plugs respectively, before forming the first and second bitlines, wherein the first bitline is coupled to the first drain region through the third plug and the first plug, and wherein the second bitline is coupled to the second drain region through the third plug and the first plug.

6. The method of claim 1, wherein forming the second electrodes of the first and second ferroelectric capacitors comprises:

forming a second electrode material layer of the ferroelectric capacitors on the entire surface including the first and second ferroelectric layers; and selectively removing the second electrode material layer to form the second electrode of the first ferroelectric capacitor and the second electrode of the second ferroelectric capacitor, wherein the second electrodes are symmetrically formed in parallel to each other along the first and second split wordlines.

7. The method of claim 6, wherein the second electrode of the first ferroelectric capacitor is formed from a region between source and drain regions of the second active region to the field region below the first active region, and wherein the second electrode of the second ferroelectric capacitor is formed from a region between source and drain regions of the first active region to the field region on the second active region.

8. The method of claim 1, further comprising forming a barrier metal layer after forming the first and second plugs.

9. The method of claim 1, wherein the second electrodes of the first and second ferroelectric capacitors are island shaped, and wherein the first and second active regions are asymmetrically positioned.

10. The method of claim 1, wherein forming the conductive layers includes forming a first conductive layer and a second conductive layer, wherein the first conductive layer directly connects the second electrode of the first ferroelectric capacitor with the second plug coupled to the first source region of the first active region, and wherein the second conductive layer directly connects the second electrode of the second ferroelectric capacitor with the second plug coupled to the first source region of the second active region.

11. A method for fabricating a device, the method comprising:

forming first and second split wordlines on a substrate extending along a first direction separated by a prescribed interval;

forming first and second impurity regions respectively along apposite sides of each of the first and second split wordlines;

forming an insulating layer covering the first and second impurity regions and the first and second split wordlines;

respectively forming first and second capacitors over the second and first split wordlines, wherein the first and second capacitors each include a first electrode formed on the insulating layer and a second electrode formed over the first electrode;

respectively forming conductive layers that respectively couple the first impurity regions to corresponding second electrodes of the first and second capacitors; and forming first and second bitlines across the first and second split wordlines, wherein the first and second bitlines are respectively coupled to the second impurity regions.

12. The method of claim 11, wherein the first and second capacitors are ferroelectric capacitors.

13. The method of claim 12, wherein the forming the first and second ferroelectric capacitors comprises:

forming a the first electrode of the first ferroelectric capacitor over the second split wordline and forming the first electrode of the second ferroelectric capacitor over the first split wordline;

forming ferroelectric layers respectively over surfaces of the first electrodes of the first and second ferroelectric capacitors; and forming the second electrodes of the first and second ferroelectric capacitors respectively over surfaces of the ferroelectric layers.

14. The method of claim 13, further comprising:

forming field region and defining active regions surrounded with the field region before forming the first and second split wordlines; and wherein forming the second electrodes of the first and second ferroelectric capacitors comprises:

forming an electrode material layer on an entire surface including the ferroelectric layers; and forming the second electrodes of the first and second ferroelectric capacitors by selectively removing the electrode material layer, wherein the second electrode of the first ferroelectric capacitor and the second electrode of the second ferroelectric capacitor are respectively formed over the field regions.

15. The method of claim 13, wherein forming the second electrodes of the first and second ferroelectric capacitors comprises:

forming a second electrode material layer of the ferroelectric capacitors on an entire surface including the ferroelectric layers; and selectively removing the second electrode material layer to form the second electrode of the first ferroelectric capacitor and the second electrode of the second ferroelectric capacitor, wherein the second electrodes ate symmetrically formed in parallel to each other along the first and second split wordlines.

16. The method of claim 15, wherein the second electrode of the first ferroelectric capacitor is formed from a region between source and drain regions of a second active region to a field region below a first active region, and wherein the second electrode of the second ferroelectric capacitor is formed from a region between source and drain regions of the first active region to a field region on the second active region.

17. The method of claim 12, wherein the first and second impurity regions are respectively source regions and drain regions, and wherein forming the conductive layers comprises forming plugs coupled to the source regions.

18. The method of claim 11, wherein the first electrode of the first capacitor is formed over the second split wordline and an insulating layer is formed therebetween, and wherein the first electrode of the second capacitor is formed over the first split wordline and an insulating layer is formed therebetween.

* * * * *